US012757402B2

(12) United States Patent
Kim et al.

(10) Patent No.: US 12,757,402 B2
(45) Date of Patent: Oct. 6, 2026

(54) THREE-DIMENSIONAL SEMICONDUCTOR MEMORY DEVICE, ELECTRONIC SYSTEM INCLUDING THE SAME, AND METHOD OF FABRICATING THE SAME

(71) Applicant: Samsung Electronics Co., Ltd., Suwon-si (KR)

(72) Inventors: Jiwon Kim, Suwon-si (KR); Jiyoung Kim, Suwon-si (KR); Dohyung Kim, Suwon-si (KR); Sukkang Sung, Suwon-si (KR); Takuya Futatsuyama, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 664 days.

(21) Appl. No.: 18/118,776

(22) Filed: Mar. 8, 2023

(65) Prior Publication Data

US 2024/0023337 A1 Jan. 18, 2024

(30) Foreign Application Priority Data

Jul. 15, 2022 (KR) ........................ 10-2022-0087261

(51) Int. Cl.

| | |
|---|---|
| ***H10B 43/40*** | (2023.01) |
| ***H10B 43/10*** | (2023.01) |
| ***H10B 43/27*** | (2023.01) |
| ***H10B 43/35*** | (2023.01) |

(Continued)

(52) U.S. Cl.

CPC ............. *H10B 43/40* (2023.02); *H10B 43/10* (2023.02); *H10B 43/27* (2023.02); *H10B 43/35* (2023.02); *H10W 20/42* (2026.01); *H10W 20/435* (2026.01)

(58) Field of Classification Search

CPC ......... H10B 43/40; H10B 43/27; H10B 43/35

See application file for complete search history.

(56) References Cited

U.S. PATENT DOCUMENTS 10,283,452 B2 5/2019 Zhu et al.
10,748,924 B2 8/2020 Kim
2020/0161327 A1* 5/2020 Lee .................... H10D 30/6728

(Continued)

FOREIGN PATENT DOCUMENTS

KR 10-2019-0122372 A 10/2019

*Primary Examiner* — Marlon T Fletcher
*Assistant Examiner* — Samuel Jonathan Smith
(74) *Attorney, Agent, or Firm* — Wolf, Greenfield & Sacks, P.C.

(57) ABSTRACT

Disclosed is a semiconductor device comprising a peripheral circuit structure on a first substrate, a cell array structure on the peripheral circuit structure, and a backside structure on the cell array structure. The cell array structure includes a stack structure including gate electrodes and interlayer dielectric layers that are alternately stacked, through plugs that extend in a first direction through the stack structure and each including a first surface adjacent to the backside structure and a second surface opposite to the first surface, a middle circuit structure between the stack structure and the peripheral circuit structure and connected to the peripheral circuit structure, and a connection plug connected to the middle circuit structure and the backside structure. The through plugs include a first through plug connected through the first surface to the backside structure, and a second through plug connected through the second surface to the middle circuit structure.

20 Claims, 20 Drawing Sheets

(51) Int. Cl.
*H10W 20/41* (2026.01)
*H10W 20/42* (2026.01)

(56) References Cited

U.S. PATENT DOCUMENTS

| | | | | |
|---|---|---|---|---|
| 2021/0210504 | A1* | 7/2021 | Otsu | H10B 43/27 |
| 2021/0366919 | A1 | 11/2021 | Sung et al. | |
| 2021/0384218 | A1 | 12/2021 | Baek | |
| 2022/0045045 | A1 | 2/2022 | Lee | |
| 2022/0045089 | A1* | 2/2022 | Mizutani | H01L 23/528 |
| 2022/0068883 | A1 | 3/2022 | Xiao et al. | |
| 2022/0367485 | A1* | 11/2022 | Park | H10B 43/35 |

* cited by examiner

THREE-DIMENSIONAL SEMICONDUCTOR MEMORY DEVICE, ELECTRONIC SYSTEM INCLUDING THE SAME, AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0087261 filed on Jul. 15, 2022 in the Korean Intellectual Property Office, the disclosure of which is hereby incorporated by reference in its entirety.

BACKGROUND

The present inventive concepts relate to a three-dimensional semiconductor memory device, an electronic system including the same, and a method of fabricating the same, and more particularly, to a three-dimensional semiconductor memory device including a peripheral circuit structure and a cell array structure that are coupled through bonding pads, an electronic system including the same, and a method of fabricating the same.

It can be necessary to have a semiconductor device capable of storing a large amount of data in an electronic system which requires data storage. Semiconductor devices have been highly integrated to meet high performance and low manufacturing cost which are required by customers. Integration of typical two-dimensional or planar semiconductor devices is primarily determined by the area occupied by a unit memory cell, such that it is greatly influenced by the level of technology for forming fine patterns. However, processing equipment needed to increase pattern fineness can be expensive and may set a practical limitation on increasing the integration of the two-dimensional or planar semiconductor devices. Therefore, three-dimensional semiconductor memory devices having three-dimensionally arranged memory cells have been proposed.

SUMMARY

Some embodiments of the present inventive concepts provide a three-dimensional semiconductor memory device capable of being easily fabricated.

An object of the present inventive concepts is not limited to the mentioned above, and other objects which have not been mentioned above will be clearly understood to those skilled in the art from the following description.

According to some embodiments of the present inventive concepts, a three-dimensional semiconductor memory device may comprise a peripheral circuit structure on a first substrate, a cell array structure on the peripheral circuit structure, and a backside structure on the cell array structure. The cell array structure may include: a stack structure including gate electrodes and interlayer dielectric layers that are alternately stacked along a first direction; through plugs that extend in the first direction through the stack structure, each of the through plugs including a first surface adjacent to the backside structure and a second surface opposite to the first surface; a middle circuit structure between the stack structure and the peripheral circuit structure, the middle circuit structure being electrically connected to the peripheral circuit structure; and a connection plug electrically connected to the middle circuit structure and the backside structure. The through plugs may include: a first through plug electrically connected through the first surface to the backside structure; and a second through plug electrically connected through the second surface to the middle circuit structure.

According to some embodiments of the present inventive concepts, a three-dimensional semiconductor memory device may comprise a peripheral circuit structure on a first substrate, a cell array structure on the peripheral circuit structure, and a backside structure on the cell array structure. The cell array structure may include: a stack structure including gate electrodes and interlayer dielectric layers that are alternately stacked along a first direction; a source structure on the stack structure; a vertical structure that extends in the first direction through the stack structure and is electrically connected to the source structure; a through plug that extends in the first direction through the stack structure, the through plug including a first surface adjacent to the backside structure and a second surface opposite to the first surface; a middle circuit structure between the stack structure and the peripheral circuit structure, the middle circuit structure being electrically connected to the peripheral circuit structure; and a connection plug electrically connected to the middle circuit structure and the backside structure. The backside structure may include: a second substrate on the source structure; backside contact plugs electrically connected to the through plug and the connection plug, respectively, at least a portion of the backside contact plugs extending in the second substrate; and a backside contact line that electrically connects the backside contact plugs to each other. The through plug may be electrically connected through the first surface to the backside structure and the connection plug. The first surface may be higher in the first direction than a top surface of an uppermost one of the interlayer dielectric layers with the first substrate providing a base reference plane.

According to some embodiments of the present inventive concepts, an electronic system may comprise: a three-dimensional semiconductor memory device including a peripheral circuit structure, a cell array structure, and a backside structure that are stacked on a first substrate; and a controller that is electrically connected through an input/output pad to the three-dimensional semiconductor memory device and is configured to control the three-dimensional semiconductor memory device. The cell array structure may include: a stack structure including gate electrodes and interlayer dielectric layers that are alternately stacked along a first direction; through plugs that extend in the first direction through the stack structure, each of the through plugs including a first surface adjacent to the backside structure and a second surface opposite to the first surface; a middle circuit structure between the stack structure and the peripheral circuit structure, the middle circuit structure being electrically connected to the peripheral circuit structure; and a connection plug electrically connected to the middle circuit structure and the backside structure. The through plugs may include a first through plug that is electrically connected through the first surface to the backside structure and a second through plug that is electrically connected through the second surface to the middle circuit structure.

DETAILED DESCRIPTION OF EMBODIMENTS

The following will describe in detail a three-dimensional semiconductor memory device, an electronic system including the same, and a method of fabricating the same with reference to the accompanying drawings.

Figure 1:
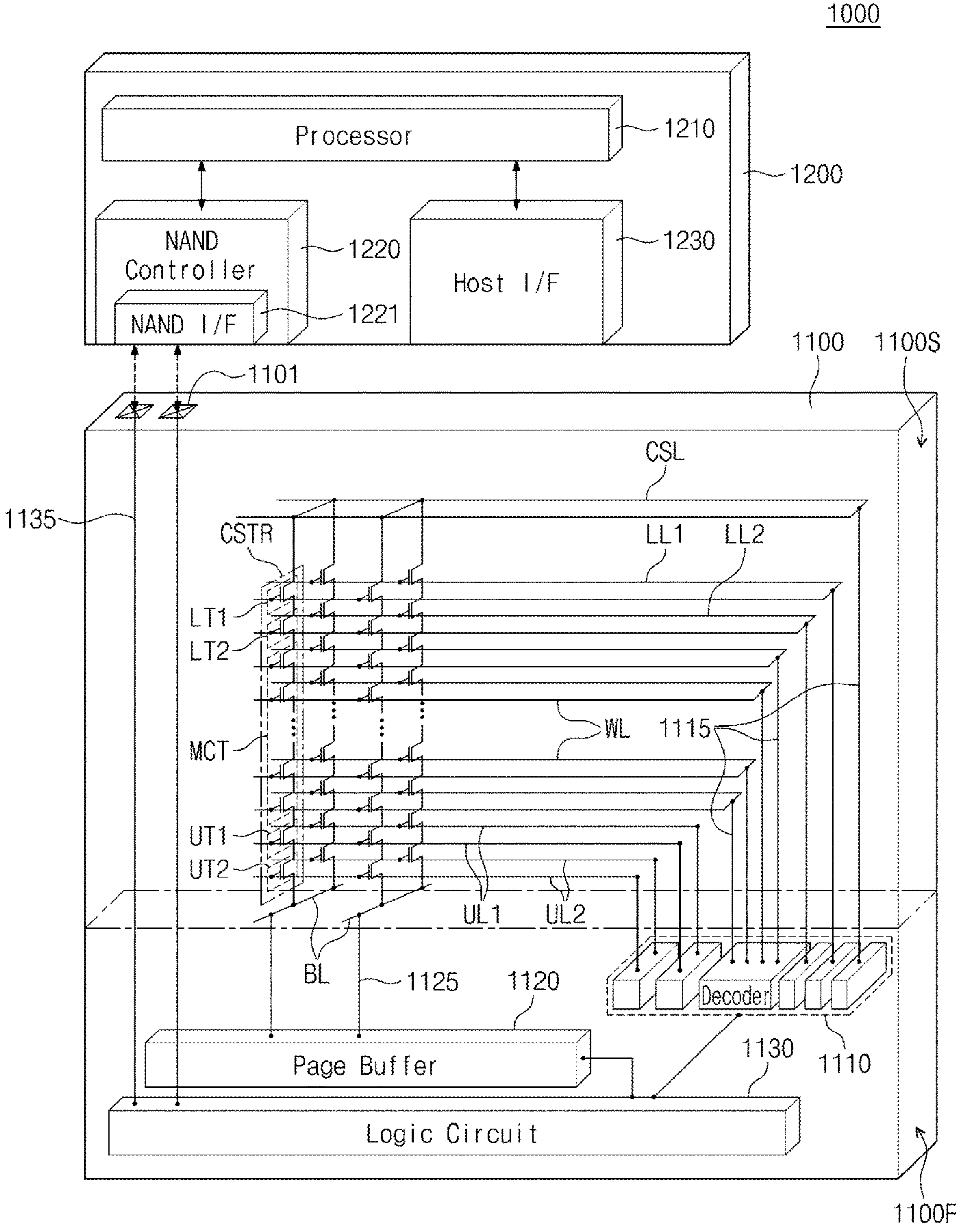
FIG. 1 illustrates a simplified block diagram showing an electronic system that includes a three-dimensional semiconductor memory device according to some embodiments of the present inventive concepts.

FIG. 1 illustrates a simplified block diagram showing an electronic system that includes a three-dimensional semiconductor memory device according to some embodiments of the present inventive concepts.

Referring to FIG. 1, an electronic system 1000 according to some embodiments of the present inventive concepts may include a three-dimensional semiconductor memory device 1100 and a controller 1200 electrically connected to the three-dimensional semiconductor memory device 1100. The electronic system 1000 may be a storage device that includes a single or a plurality of three-dimensional semiconductor memory devices 1100 or may be an electronic device that includes the storage device. For example, the electronic system 1000 may be a solid state drive (SSD) device, a universal serial bus (USB), a computing system, a medical apparatus, or a communication apparatus each of which includes a single or a plurality of three-dimensional semiconductor memory devices 1100.

The three-dimensional semiconductor memory device 1100 may be a nonvolatile memory device, such as a three-dimensional NAND Flash memory device which will be discussed below. The three-dimensional semiconductor memory device 1100 may include a first region 1100F and a second region 1100S on the first region 1100F. Different from that shown, the first region 1100F may be disposed on a side of the second region 1100S. The first region 1100F may be a peripheral circuit region that includes a decoder circuit 1110, a page buffer 1120, and a logic circuit 1130. The second region 1100S may be a memory cell region including bit lines BL, a common source line CSL, word lines WL, first lines LL1 and LL2, second lines UL1 and UL2, and memory cell strings CSTR between the bit lines BL and the common source line CSL.

In the second region 1100S, each of the memory cell strings CSTR may include first transistors LT1 and LT2 adjacent to the common source line CSL, second transistors UT1 and UT2 adjacent to the bit lines BL, and a plurality of memory cell transistors MCT between the first transistors LT1 and LT2 and the second transistors UT1 and UT2. The number of the first transistors LT1 and LT2 and of the second transistors UT1 and UT2 may be variously changed in accordance with embodiments. The memory cell strings CSTR may be positioned between the common source line CSL and the first region 1100F.

For example, the second transistors UT1 and UT2 may include a string selection transistor, and the first transistors LT1 and LT2 may include a ground selection transistor. The first lines LL1 and LL2 may be gate electrodes of the first transistors LT1 and LT2, respectively. The word lines WL may be gate electrodes of the memory cell transistors MCT, and the second lines UL1 and UL2 may be gate electrodes of the second transistors UT1 and UT2.

For example, the first transistors LT1 and LT2 may include a first erasure control transistor LT1 and a ground selection transistor LT2 that are connected in series. For example, the second transistors UT1 and UT2 may include a string selection transistor UT1 and a second erasure control transistor UT2 that are connected in series. One or both of the first and second erasure control transistors LT1 and UT2 may be employed to perform an erase operation in which a gate induced drain leakage (GIDL) phenomenon is used to erase data stored in the memory cell transistors MCT.

The common source line CSL, the first lines LL1 and LL2, the word lines WL, and the second lines UL1 and UL2 may be electrically connected to the decoder circuit 1110 through first connection lines 1115 that extend from the first region 1100F toward the second region 1100S. The bit lines BL may be electrically connected to the page buffer 1120 through second connection lines 1125 that extend from the first region 1100F toward the second region 1100S.

In the first region 1100F, the decoder circuit 1110 and the page buffer 1120 may perform a control operation with respect to at least one selection memory cell transistor among the plurality of memory cell transistors MCT. The logic circuit 1130 may control the decoder circuit 1110 and the page buffer 1120. The three-dimensional semiconductor memory device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first region 1100F toward the second region 1100S.

The controller 1200 may include a processor 1210, a NAND controller 1220, and a host interface 1230. According to some embodiments, the electronic system 1000 may include a plurality of three-dimensional semiconductor memory devices 1100, and in this case, the controller 1200 may control the plurality of three-dimensional semiconductor memory devices 1100.

The processor 1210 may control an overall operation of the electronic system 1000 that includes the controller 1200. The processor 1210 may operate based on certain firmware, and may control the NAND controller 1220 to access the three-dimensional semiconductor memory device 1100. The NAND controller 1220 may include a NAND interface 1221 that processes communication with the three-dimensional semiconductor memory device 1100. The NAND interface 1221 may be used to transfer therethrough a control command which is intended to control the three-dimensional semiconductor memory device 1100, data which is intended to be written on the memory cell transistors MCT of the three-dimensional semiconductor memory device 1100, and/or data which is intended to be read from the memory cell transistors MCT of the three-dimensional semiconductor memory device 1100. The host interface 1230 may provide the electronic system 1000 with communication with an external host. When a control command is received through the host interface 1230 from an external host, the three-dimensional semiconductor memory device 1100 may be controlled by the processor 1210 in response to the control command.

Figure 2:
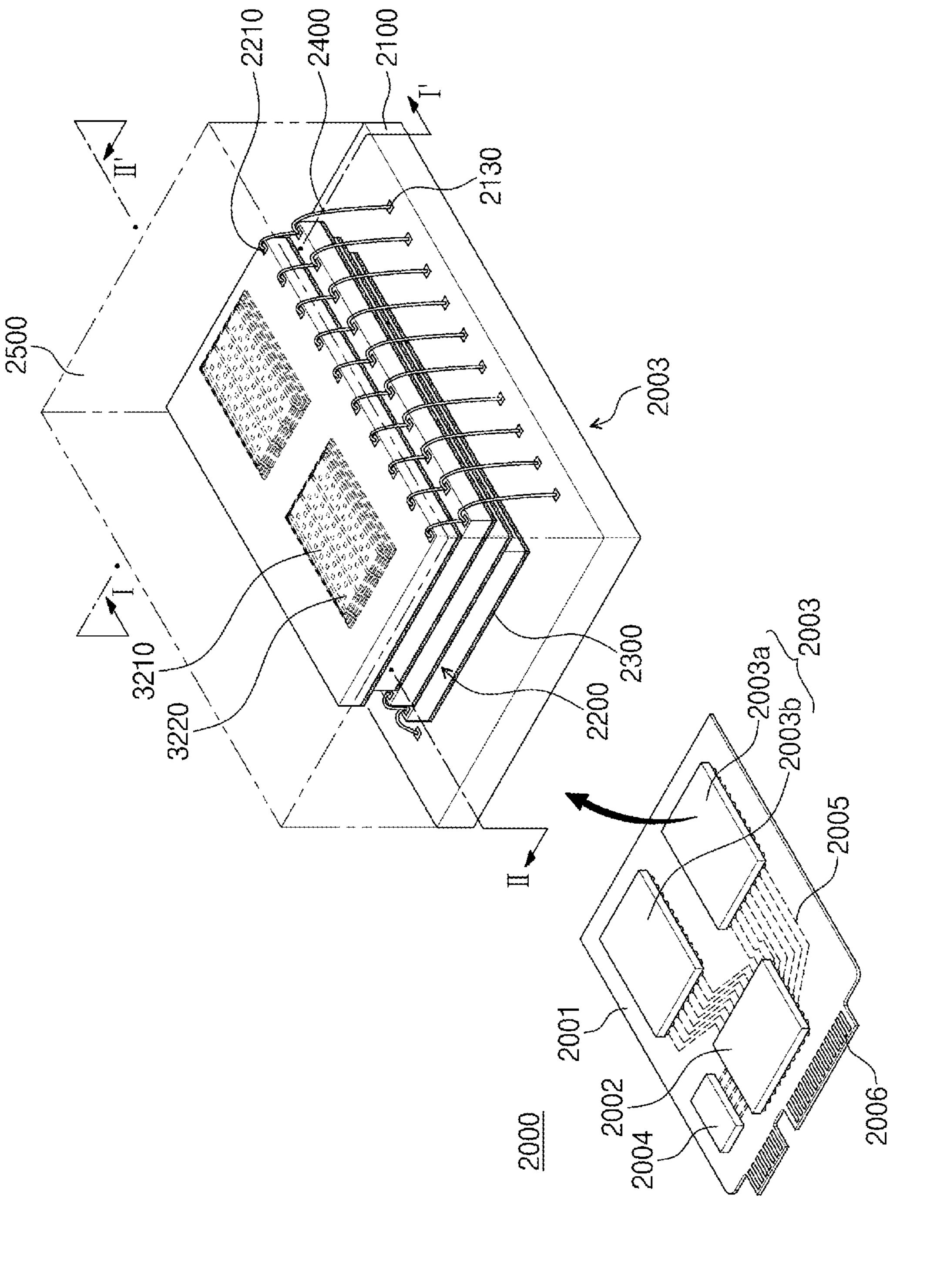
FIG. 2 illustrates a simplified perspective view showing an electronic system that includes a three-dimensional semiconductor memory device according to some embodiments of the present inventive concepts.

FIG. 2 illustrates a simplified perspective view showing an electronic system that includes a three-dimensional semiconductor memory device according to some embodiments of the present inventive concepts.

Referring to FIG. 2, an electronic system 2000 according to some embodiments of the present inventive concepts may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 through wiring patterns 2005 provided in the main board 2001.

The main board 2001 may include a connector 2006 including a plurality of pins that are provided to have connection with an external host. The number and arrangement of the plurality of pins on the connector 2006 may be changed based on a communication interface between the electronic system 2000 and the external host. The electronic system 2000 may communicate with an external host through one or more interfaces, for example, universal serial bus (USB), peripheral component interconnect express (PIC-Express), serial advanced technology attachment (SATA), and M-PHY for universal flash storage (UFS). For example, the electronic system 2000 may operate with power supplied through the connector 2006 from an external host. The electronic system 2000 may further include a power management integrated circuit (PMIC) that distributes the power supplied from the external host to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but also a DRAM controller for controlling the DRAM 2004.

The semiconductor package 2003 may include first and second semiconductor packages **2003*a* and 2003*b* that are spaced apart from each other. Each of the first and second semiconductor packages 2003*a* and 2003*b* may include a plurality of semiconductor chips 2200. Each of the first and second semiconductor packages 2003*a* and 2003*b* may include a package substrate 2100, semiconductor chips 2200 on the package substrate 2100, adhesion layers 2300 correspondingly disposed on bottom surfaces of the semiconductor chips 2200, connection structures 2400 that electrically connect the semiconductor chips 2200 to the package substrate 2100, and a molding layer 2500 with which the semiconductor chips 2200 and the connection structures 2400 are covered on the package substrate 2100**.

The package substrate 2100 may be an integrated circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and memory channel structures 3220. Each of the semiconductor chips 2200 may include a three-dimensional semiconductor memory device which will be discussed below.

The connection structures 2400 may be, for example, bonding wires that electrically connect the input/output pads 2210 to the package upper pads 2130. Therefore, in each of the first and second semiconductor packages **2003*a* and 2003*b*, the semiconductor chips 2200 may be electrically connected to each other in a wire bonding manner, and may be electrically connected to the package upper pads 2130 of the package substrate 2100. In some embodiments, in each of the first and second semiconductor packages 2003*a* and 2003*b*, the semiconductor chips 2200 may be electrically connected to each other via through silicon vias instead of the connection structures 2400** or the bonding wires.

Differently from that shown, the controller 2002 and the semiconductor chips 2200 may be included in a single package. The controller 2002 and the semiconductor chips 2200 may be mounted on a separate interposer substrate other than the main board 2001, and may be connected to each other through wiring lines provided in the interposer substrate.

Figure 3:
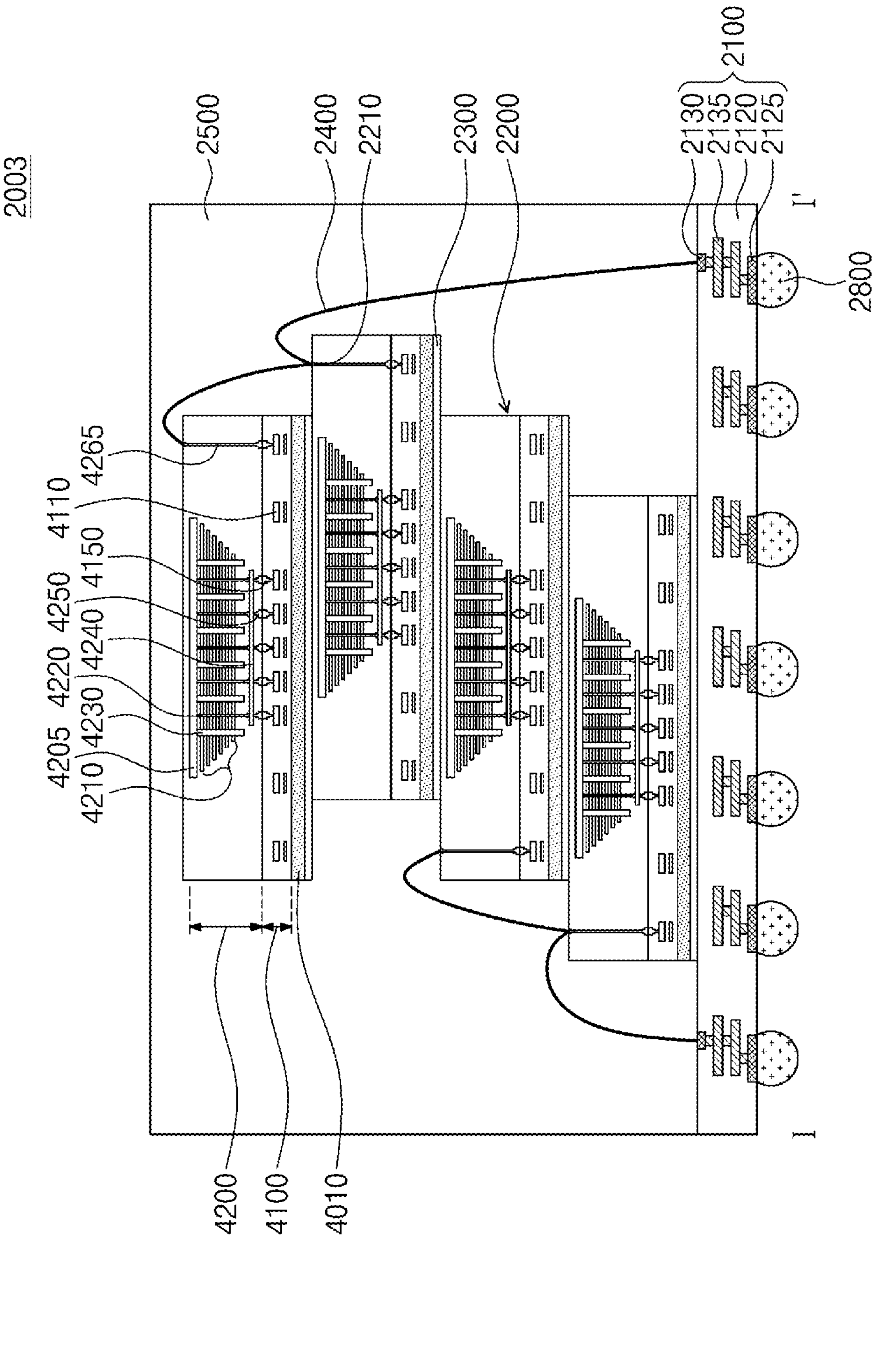
FIGS. 3 and 4 illustrate cross-sectional views respectively taken along lines I-I' and II-II' of FIG. 2, showing a semiconductor package that includes a three-dimensional semiconductor memory device according to some embodiments of the present inventive concepts.
Figure 4:
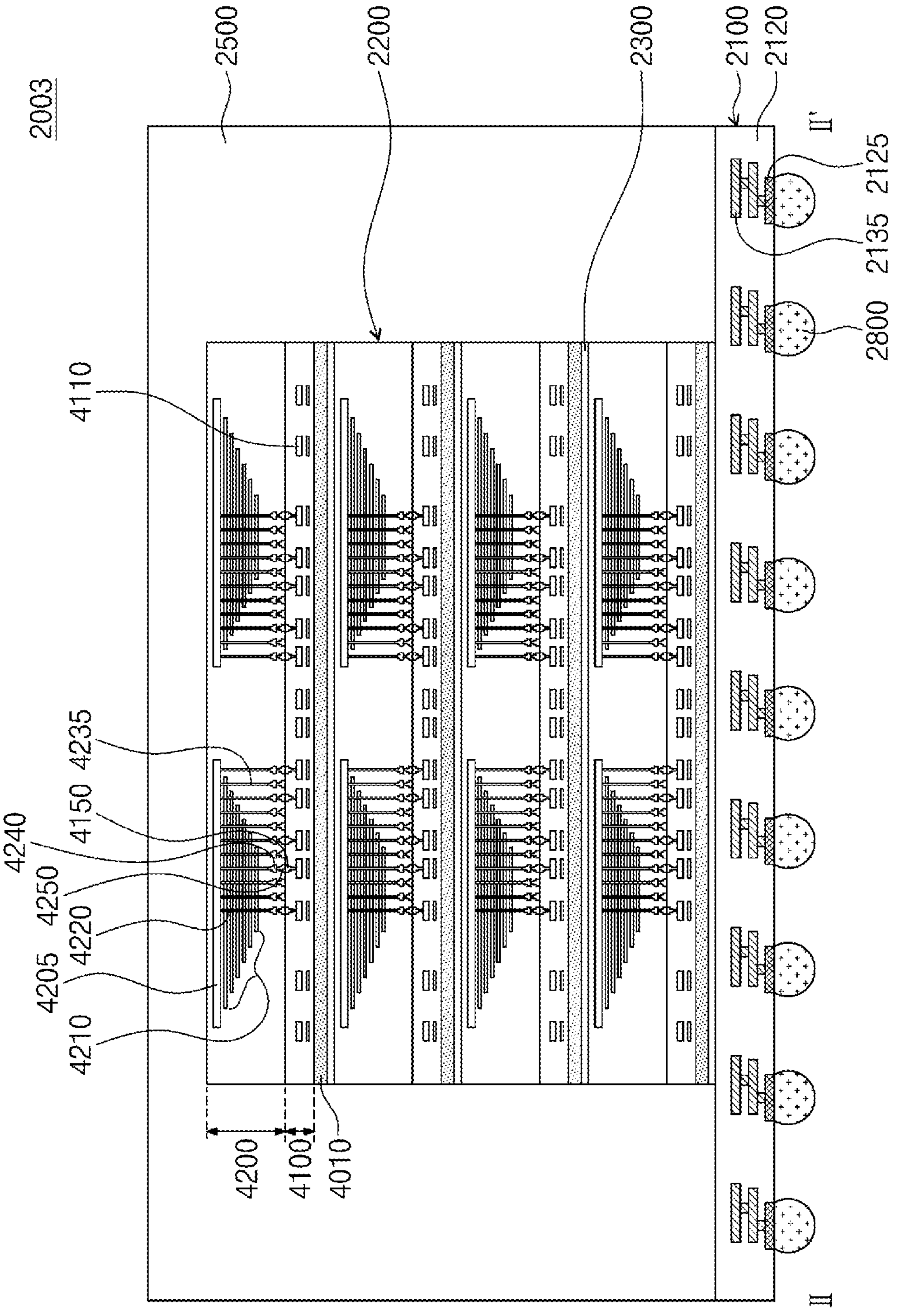

FIGS. 3 and 4 illustrate cross-sectional views respectively taken along lines I-I' and II-II' of FIG. 2, showing a semiconductor package that includes a three-dimensional semiconductor memory device according to some embodiments of the present inventive concepts.

Referring to FIGS. 3 and 4, a semiconductor package 2003 may include a package substrate 2100, a plurality of semiconductor chips 2200 on the package substrate 2100, and a molding layer 2500 that covers the package substrate 2100 and the semiconductor chips 2200.

The package substrate 2100 may include a package substrate body 2120, upper pads 2130 disposed or exposed on a top surface of the package substrate body 2120, lower pads 2125 disposed or exposed on a bottom surface of the package substrate body 2120, and internal lines 2135 through which the upper pads 2130 and the lower pads 2125 are electrically connected within the package substrate body 2120. The upper pads 2130 may be electrically connected to connection structures 2400. The lower pads 2125 may be connected through conductive connectors 2800 to the wiring patterns 2005 in the main board 2001 of the electronic system 2000 depicted in FIG. 2.

Referring to FIGS. 2 and 3, the semiconductor chips 2200 may have sidewalls that are not aligned with each other and also have other sidewalls that are aligned with each other. The semiconductor chips 2200 may be electrically connected to each other thorough the connection structures 2400 shaped like bonding wires. The semiconductor chips 2200 may be configured substantially identical to each other.

Each of the semiconductor chips 2200 may include a semiconductor substrate 4010, a first structure 4100 on the semiconductor substrate 4010, and a second structure 4200 on the first structure 4100. The second structure 4200 and the first structure 4100 may be bonded to each other in a wafer bonding manner.

The first structure 4100 may include peripheral circuit lines 4110 and first bonding pads 4150. The second structure 4200 may include a common source line 4205, a gate stack structure 4210 between the common source line 4205 and the first structure 4100, memory channel structures 4220 and separation structures 4230 that penetrate the gate stack structure 4210, and second bonding pads 4250 electrically connected to the memory channel structures 4220 and word lines (see WL of FIG. 1) of the gate stack structure 4210. For example, the second bonding pads 4250 may be electrically connected to the memory channel structures 4220 and the word lines (see WL of FIG. 1) through bit lines 4240 electrically connected to the memory channel structures 4220 and gate connection lines 4235 electrically connected to the word lines (see WL of FIG. 1). The first bonding pads 4150 of the first structure 4100 may be bonded to and in contact with the second bonding pads 4250 of the second structure 4200. The first and second bonding pads 4150 and 4250 may have their contact portions including, for example, copper (Cu).

Each of the semiconductor chips 2200 may further include input/output pads 2210 and input/output connection lines 4265 below the input/output pads 2210. The input/output connection line 4265 may be electrically connected to one of the second bonding pads 4250 and one of the peripheral circuit lines 4110.

Figure 5:
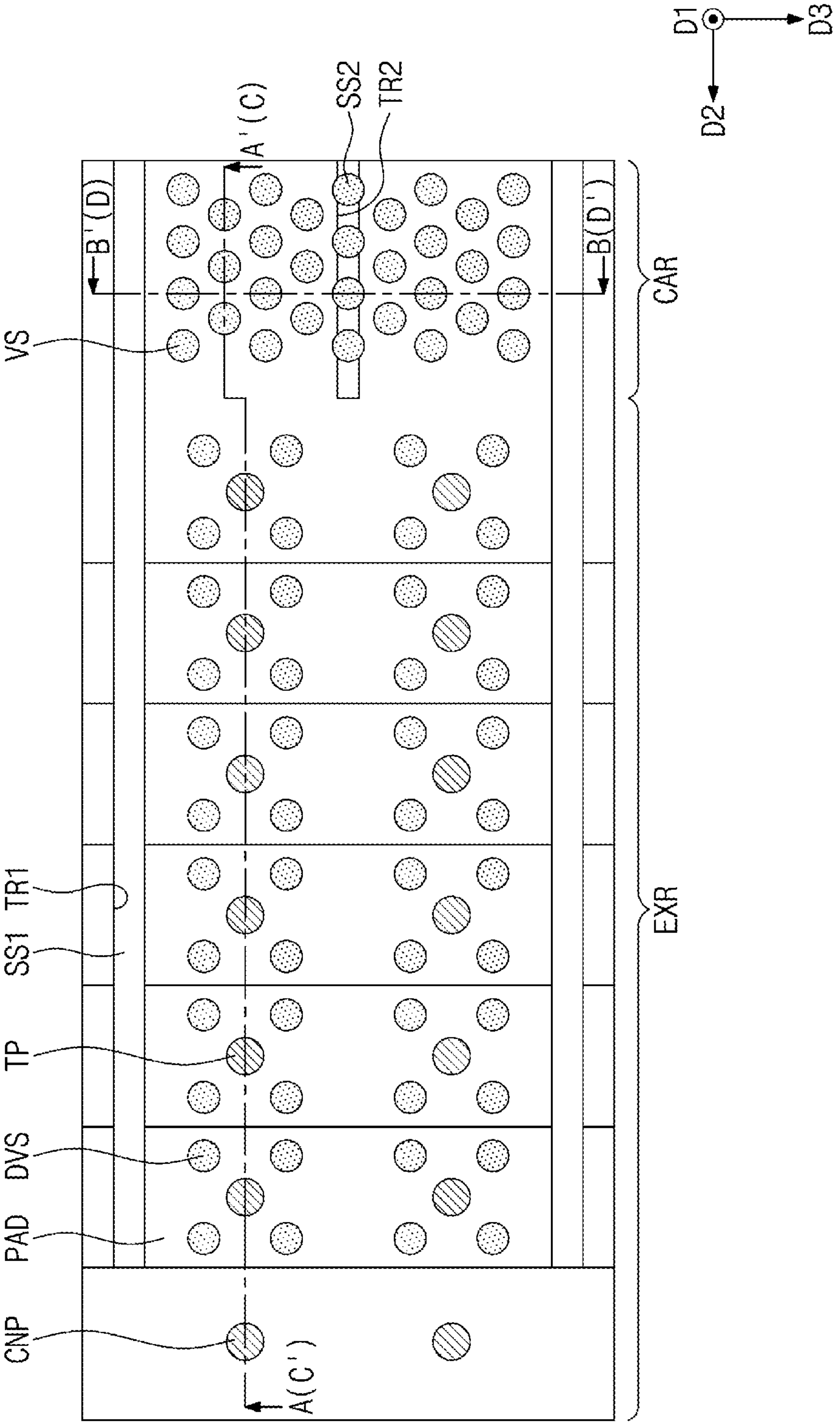
FIG. 5 illustrates a plan view showing a three-dimensional semiconductor memory device according to some embodiments of the present inventive concepts.
Figure 6A:
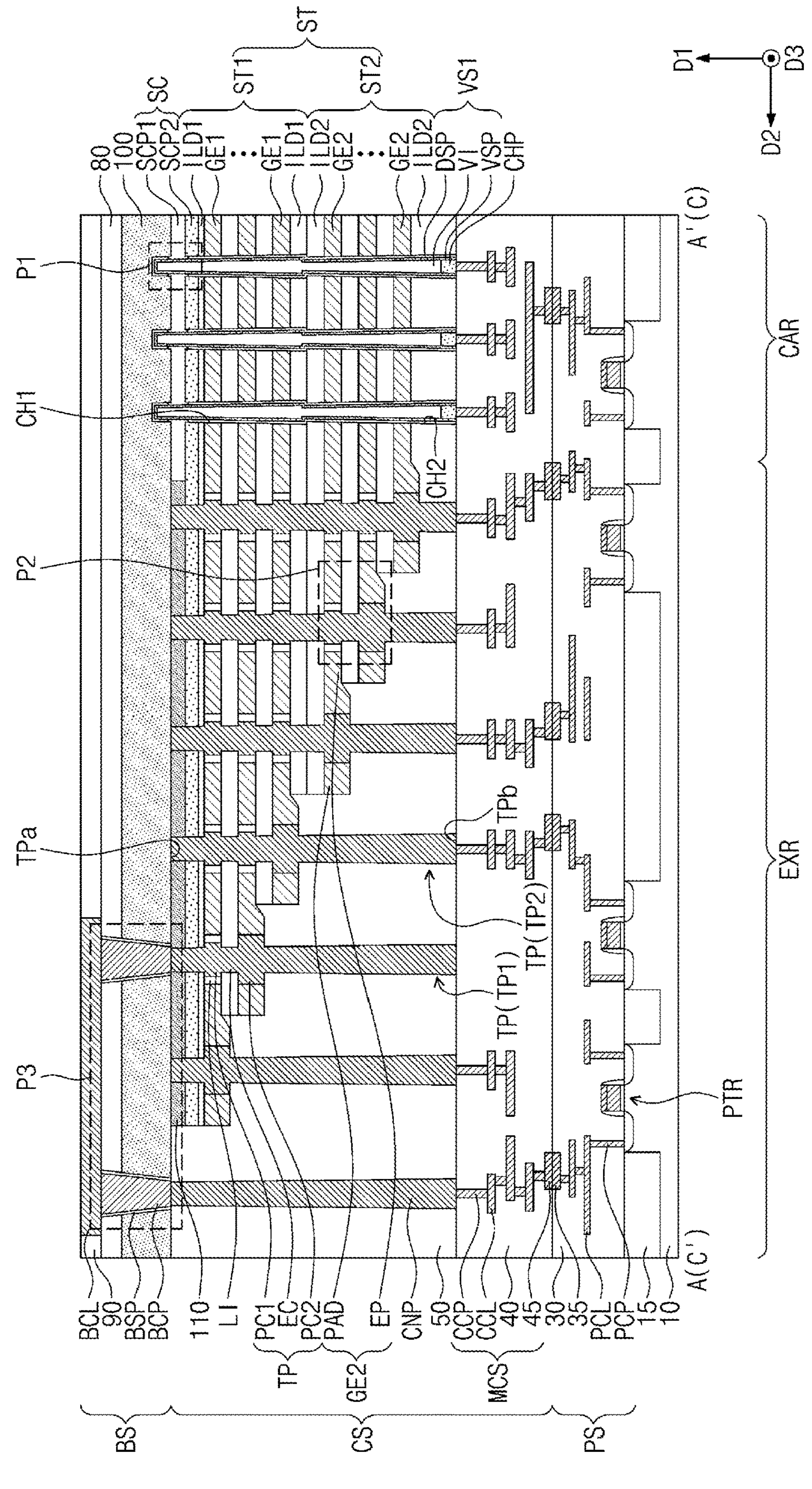
FIGS. 6A and 6B illustrate cross-sectional views respectively taken along lines A-A' and B-B' of FIG. 5.
Figure 6B:
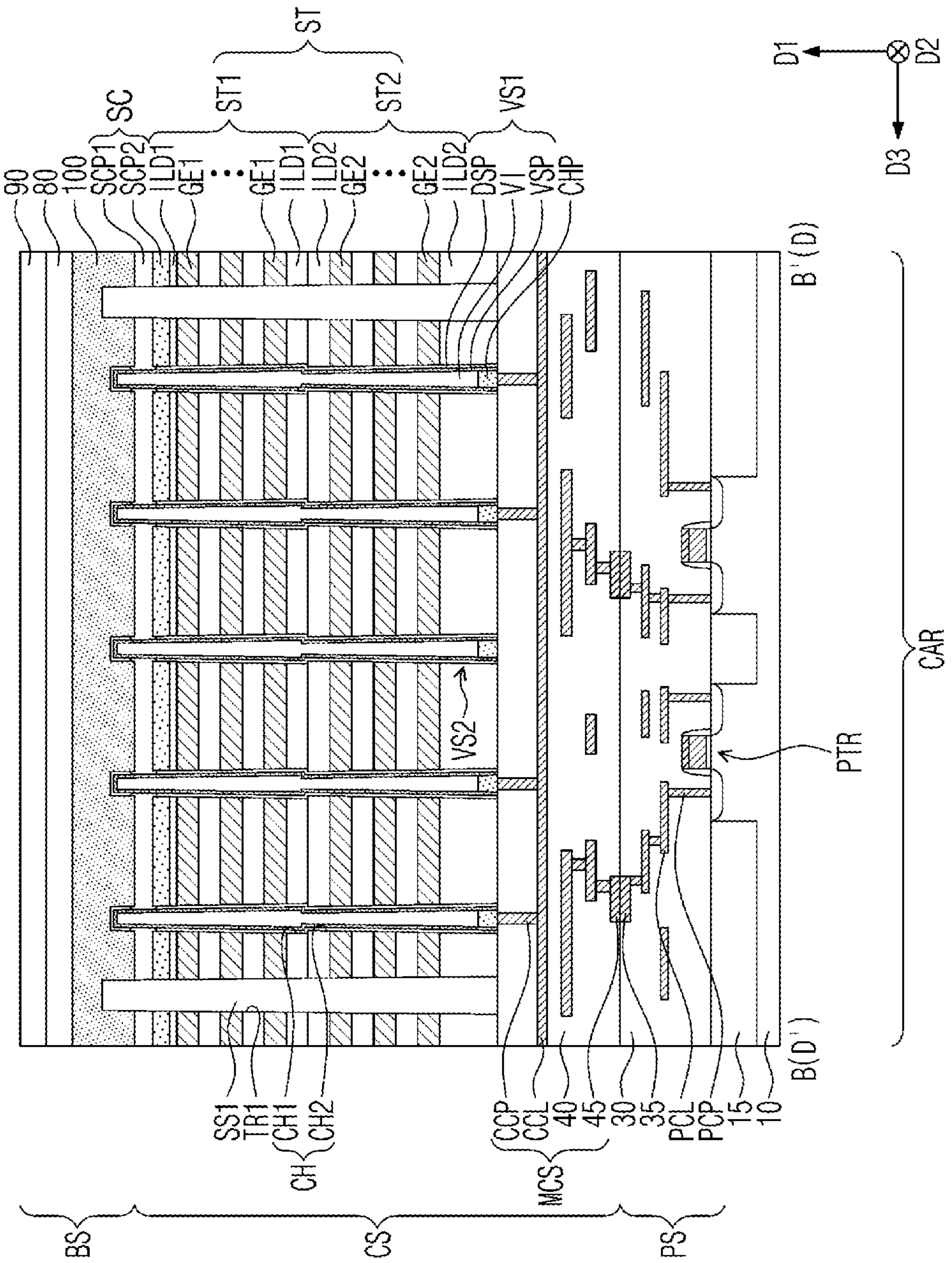
Figure 7:
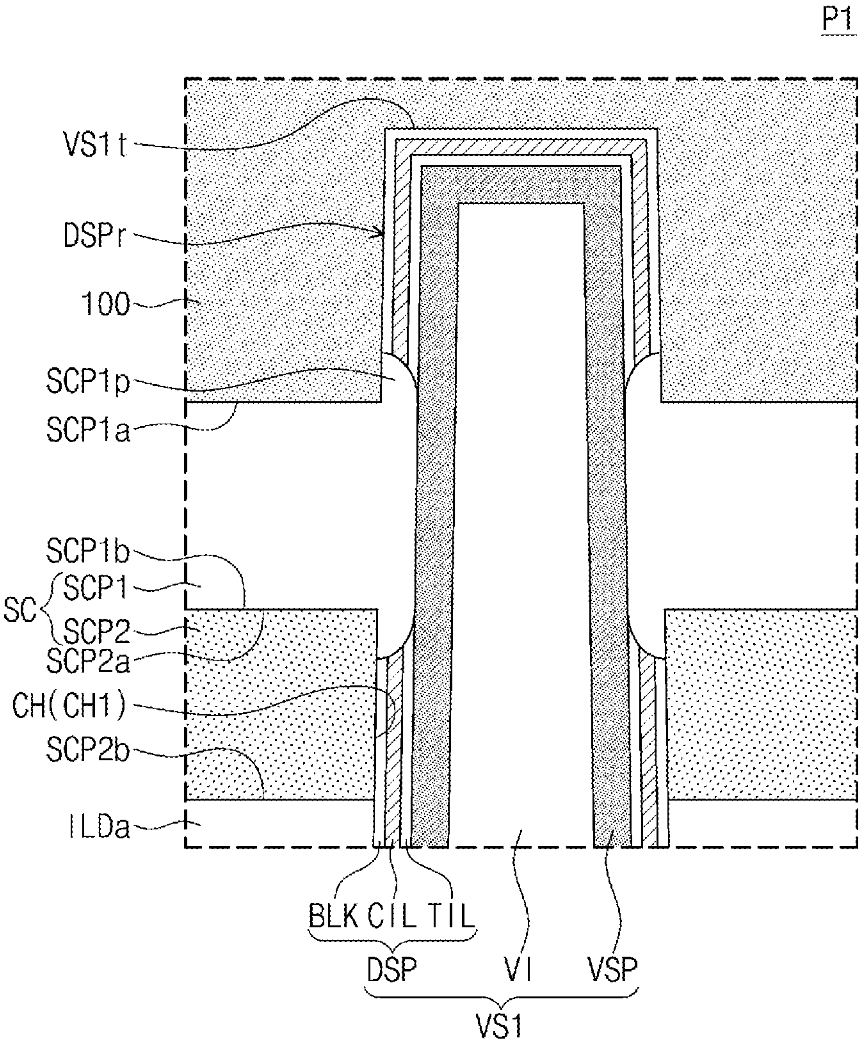
FIG. 7 illustrates an enlarged view showing section P1 of FIG. 6A.
Figure 8:
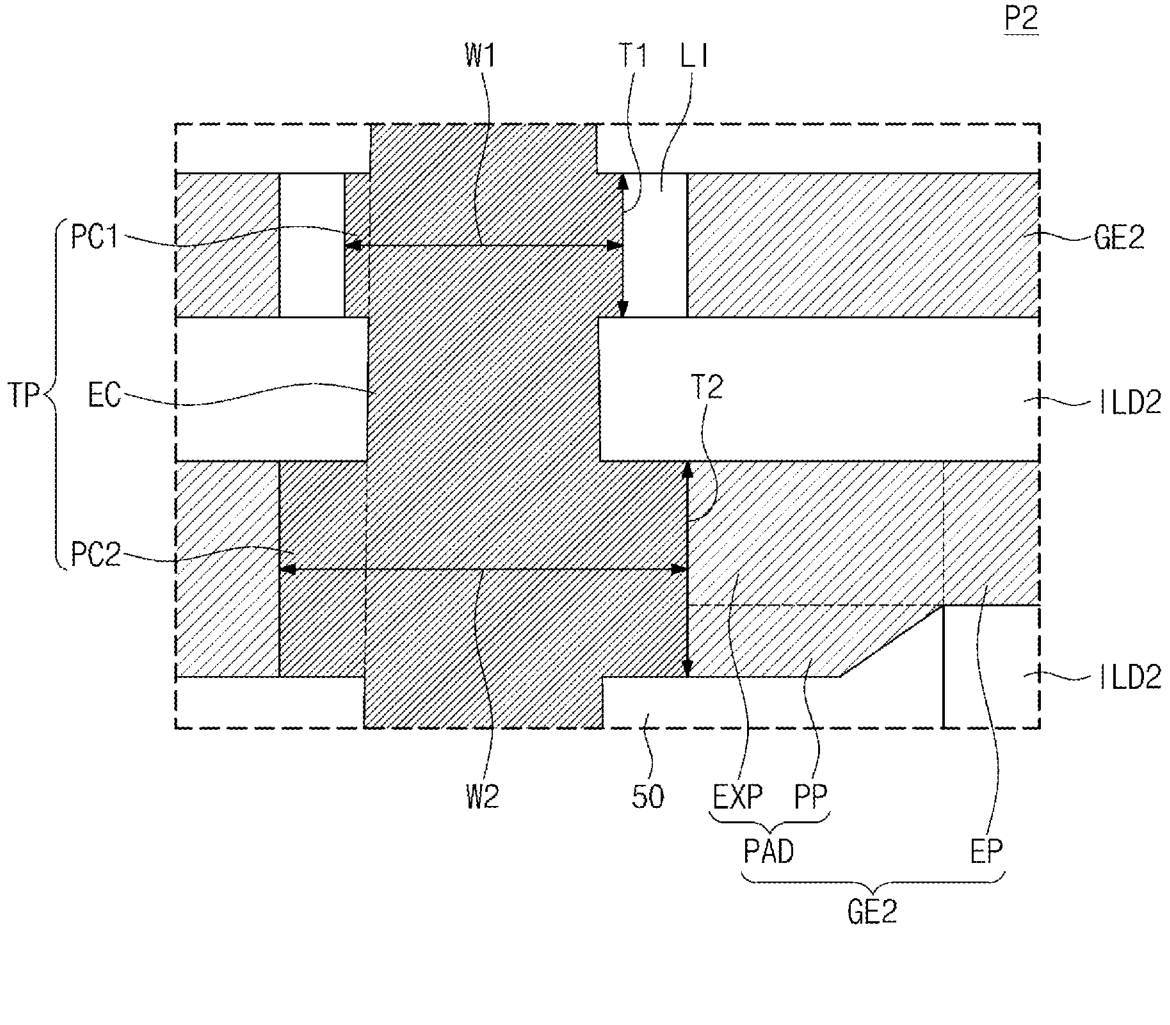
FIG. 8 illustrates an enlarged view showing section P2 of FIG. 6A.
Figure 9A:
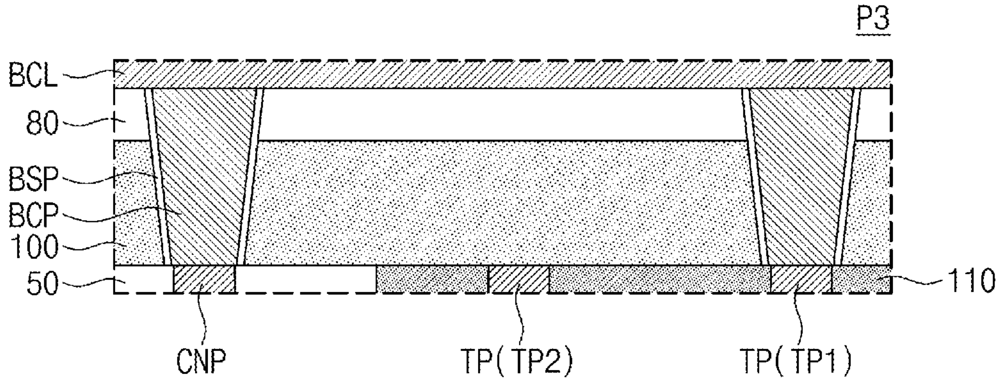
FIGS. 9A to 9C illustrate enlarged views showing section P3 of FIG. 6A.
Figure 9B:
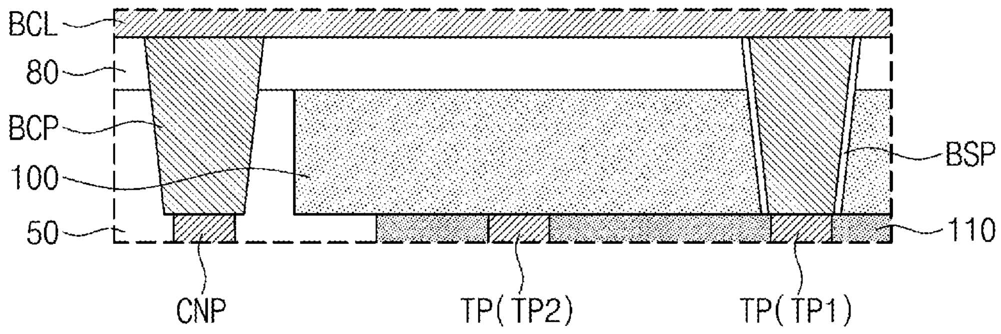
Figure 9C:
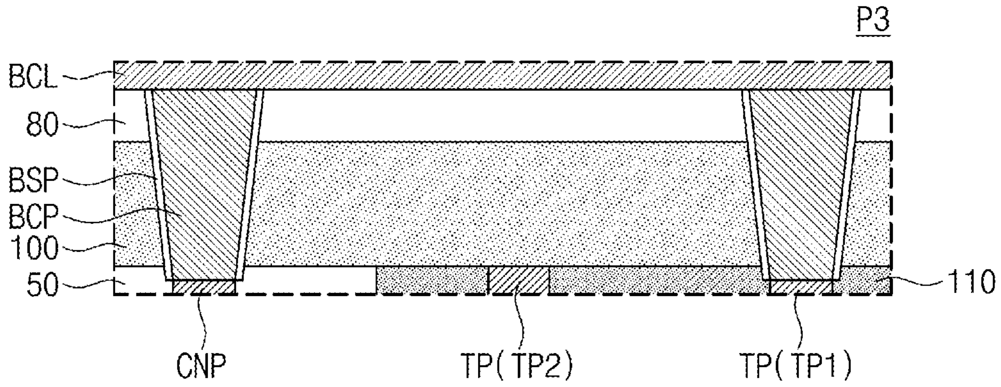

FIG. 5 illustrates a plan view showing a three-dimensional semiconductor memory device according to some embodiments of the present inventive concepts. FIGS. 6A and 6B illustrate cross-sectional views respectively taken along lines A-A' and B-B' of FIG. 5. FIG. 7 illustrates an enlarged view showing section P1 of FIG. 6A. FIG. 8 illustrates an enlarged view showing section P2 of FIG. 6A. FIGS. 9A to 9C illustrate enlarged views showing section P3 of FIG. 6A.

Referring to FIGS. 5, 6A, and 6B, a three-dimensional semiconductor memory device according to the present inventive concepts may include a peripheral circuit structure PS, a cell array structure CS, and a backside structure BS that are sequentially stacked on a first substrate 10. The first substrate 10 may correspond to the semiconductor substrate 4010 of FIG. 3 or 4. The peripheral circuit structure PS may correspond to the first structure 4100 of FIG. 3 or 4. The cell array structure CS and the backside structure BS may correspond to the second structure 4200 of FIG. 3 or 4.

As the cell array structure CS is bonded onto the peripheral circuit structure PS, it may be possible to increase a cell capacity per unit area of the three-dimensional semiconductor memory device according to the present inventive concepts. In addition, as the peripheral circuit structure PS and the cell array structure CS are manufactured separately and then bonded to each other, subsequently described peripheral transistors PTR may be prevented from being damaged due to various heat treatment processes, and accordingly, it may be possible to improve reliability and electrical properties of the three-dimensional semiconductor memory device according to the present inventive concepts.

The first substrate 10 may be, for example, a silicon substrate, a silicon-germanium substrate, a germanium substrate, or a monocrystalline epitaxial layer grown on a monocrystalline silicon substrate. The first substrate 10 may have a top surface perpendicular to a first direction D1. The top surface of the first substrate 10 may be parallel to a second direction D2 and a third direction D3. The first, second, and third directions D1, D2, and D3 may be directions orthogonal to each other. A device isolation layer 15 may be provided in the first substrate 10. The device isolation layer 15 may define an active section of the first substrate 10.

The peripheral circuit structure PS may include peripheral transistors PTR on the first substrate 10, peripheral contact plugs PCP, peripheral circuit lines PCL electrically connected through the peripheral contact plugs PCP to the peripheral transistors PTR, first bonding pads 35 electrically connected to the peripheral circuit lines PCL, and a first dielectric layer 30 that surrounds the peripheral transistors PTR, the peripheral contact plugs PCP, the peripheral circuit lines PCL, and the first bonding pads 35. The peripheral transistors PTR may be provided on the active section of the first substrate 10. The peripheral circuit lines PCL may correspond to the peripheral circuit lines 4110 of FIG. 3 or 4, and the first bonding pads 35 may correspond to the first bonding pads 4150 of FIG. 3 or 4.

The peripheral contact plugs PCP may have their widths in the third direction D3 or the second direction D2, and for example, the widths of the peripheral contact plugs PCP may increase in the first direction D1. The peripheral contact plugs PCP and the peripheral circuit lines PCL may include a conductive material, such as metal.

The peripheral transistors PTR may constitute, for example, a decoder circuit (see 1110 of FIG. 1), a page buffer (see 1120 of FIG. 1), and a logic circuit (see 1130 of FIG. 1). The peripheral circuit lines PCL and the first bonding pads 35 may be electrically connected through the peripheral contact plugs PCP to the peripheral transistors PTR. Each of the peripheral transistors PTR may be, for example, an NMOS transistor or a PMOS transistor.

The first dielectric layer 30 may be provided on the first substrate 10. On the first substrate 10, the first dielectric layer 30 may cover the peripheral transistors PTR, the peripheral contact plugs PCP, and the peripheral circuit lines PCL. The first dielectric layer 30 may include a plurality of dielectric layers that constitute a multi-layered structure. For example, the first dielectric layer 30 may include one or more of silicon oxide, silicon nitride, silicon oxynitride, and/or low-k dielectric materials. The first dielectric layer 30 may not cover top surfaces of the first bonding pads 35. The first dielectric layer 30 may have a top surface substantially coplanar with those of the first bonding pads 35.

The cell array structure CS may be provided on the peripheral circuit structure PS. The cell array structure CS may include a middle circuit structure MCS on the peripheral circuit structure PS, a stack structure ST on the middle circuit structure MCS, a third dielectric layer 50 that covers the stack structure ST, first and second vertical structures VS1 and VS2 and through plugs TP that penetrate the stack structure ST, and connection plugs CNP that penetrate the third dielectric layer 50. The cell array structure CS may include a cell array region CAR and a cell array contact region EXR. The cell array contact region EXR may extend from the cell array region CAR in the second direction D2 (or in a direction traverse to the second direction D2).

The middle circuit structure MCS may include second bonding pads 45, cell contact plugs CCP, cell circuit lines CCL electrically connected through the cell contact plugs CCP to the second bonding pads 45 and the through plugs TP, and a second dielectric layer 40 that covers the second bonding pads 45, the cell contact plugs CCP, and the cell circuit lines CCL. The second bonding pads 45 may correspond to the second bonding pads 4250 of FIG. 3 or 4. Ones of the cell circuit lines CCL may correspond to the bit lines 4240 of FIG. 3 or 4.

The second dielectric layer 40 may include a plurality of dielectric layers that constitute a multi-layered structure. For example, the second dielectric layer 40 may include one or more of silicon oxide, silicon nitride, silicon oxynitride, and/or low-k dielectric materials.

The cell contact plugs CCP may have their widths in the second direction D2 or the third direction D3, and for example, the widths of the cell contact plugs CCP may increase in the first direction D1. The cell contact plugs CCP and the cell circuit lines CCL may include a conductive material, such as metal.

The second dielectric layer 40 may not cover bottom surfaces of the second bonding pads 45. The second dielectric layer 40 may have a bottom surface substantially coplanar with those of the second bonding pads 45.

The bottom surfaces of the second bonding pads 45 may be correspondingly in direct contact with the top surfaces of the first bonding pads 35. The first and second bonding pads 35 and 45 may include metal, such as copper (Cu), tungsten (W), aluminum (Al), nickel (Ni), or tin (Sn). For example, the first and second bonding pads 35 and 45 may include copper (Cu). The first and second bonding pads 35 and 45 may constitute a single unitary body without any interface therebetween. The first and second bonding pads 35 and 45 are illustrated to have their sidewalls aligned with each other, but the present inventive concepts are not limited thereto. For example, when viewed in plan, the first and second bonding pads 35 and 45 may have their sidewalls spaced apart from each other (e.g., offset from each other).

The stack structure ST and the third dielectric layer 50 may be provided on the second dielectric layer 40. The third dielectric layer 50 may surround the stack structure ST. The third dielectric layer 50 may include a plurality of dielectric layers that constitute a multi-layered structure. The third dielectric layer 50 may include, for example, one or more of silicon oxide, silicon nitride, silicon oxynitride, and/or high-k dielectric materials.

The stack structure ST may correspond to the gate stack structure 4210 of FIG. 3 or 4. The stack structure ST may be provided in plural. When viewed in plan as shown in FIG. 5, the plurality of stack structures ST may extend in the second direction D2 and may be spaced apart from each other in the third direction D3. The stack structures ST may be spaced apart from each other in the third direction D3 by a first trench TR1 which will be discussed below. For convenience of description, the following will explain a single stack structure ST, and the explanation may be equally applicable to other stack structures ST.

The stack structure ST may include a first stack structure ST1 and a second stack structure ST2. The first stack structure ST1 may include first interlayer dielectric layers ILD1 and first gate electrodes GE1 that are alternately stacked, and the second stack structure ST2 may include second interlayer dielectric layers ILD2 and second gate electrodes GE2 that are alternately stacked.

The first stack structure ST1 may be provided on the middle circuit structure MCS, and the second stack structure ST2 may be provided between the first stack structure ST1 and the middle circuit structure MCS. For example, the second stack structure ST2 may be provided on a bottom surface of a lowermost one of the first interlayer dielectric layers ILD1 included in the first stack structure ST1. An uppermost one of the second interlayer dielectric layers ILD2 included in the second stack structure ST2 may be in contact with the lowermost one of the first interlayer dielectric layers ILD1 included in the first stack structure ST1, but the present inventive concepts are not limited thereto.

The first and second gate electrodes GE1 and GE2 may include, for example, at least one selected from doped semiconductor (e.g., doped silicon), metal (e.g., tungsten, copper, or aluminum), conductive metal nitride (e.g., titanium nitride or tantalum nitride), and/or transition metal (e.g., titanium or tantalum). The first and second interlayer dielectric layers ILD1 and ILD2 may include one or more of silicon oxide, silicon nitride, silicon oxynitride, and/or low-k dielectric materials. For example, the first and second interlayer dielectric layers ILD1 and ILD2 may include high-density plasma (HDP) oxide or tetraethylorthosilicate (TEOS).

The stack structure ST may have a stepwise structure along the second direction D2 on the cell array contact region EXR. For example, the stack structure ST may have a thickness in the first direction D1 that decreases with increasing distance from an outermost one of first vertical structures VS1 which will be discussed below. For example, the stack structure ST may have a thickness in the second direction D2 that increases when moving in the first direction D1 (e.g., that increases with increasing distance from the first substrate 10). The first and second gate electrodes GE1 and GE2 may have their lengths in the second direction D2 that increase with increasing distance from the first substrate 10 (e.g., that increase when moving in the first direction D1). Among the first and second gate electrodes GE1 and GE2, a lowermost second gate electrode GE2 may have a length less than all of the other gate electrodes GE1 and GE2, and an uppermost first gate electrode GE1 may have a length greater than all of the other gate electrodes GE1 and GE2. The first and second gate electrodes GE1 and GE2 may have their sidewalls that are spaced apart from each other at a regular interval along the second direction D2.

Each of the first and second gate electrodes GE1 and GE2 may include an extension portion EP that extends in the second direction D2 and a pad portion PAD that is one end in the second direction D2 thereof. The pad portion PAD may be one section of each of the first and second gate electrodes GE1 and GE2 that constitute the stepwise structure of the stack structure ST. The pad portion PAD may have a thickness in the first direction D1 greater than a thickness in the first direction D1 of the extension portion EP. For each of the first and second gate electrodes GE1 and GE2, a top surface of the pad portion PAD may be coplanar with that of the extension portion EP. A bottom surface of the pad portion PAD may be closer to the first substrate 10 than a bottom surface of the extension portion EP.

The first and second interlayer dielectric layers ILD1 and ILD2 may be provided between the first and second gate electrodes GE1 and GE2, and may have their sidewalls aligned with those of the first and second gate electrodes GE1 and GE2 upwardly or downwardly in contact with the first and second interlayer dielectric layers ILD1 and ILD2. For example, like the first and second gate electrodes GE1 and GE2, the first and second interlayer dielectric layers ILD1 and ILD2 may have their lengths in the second direction D2 that increase with increasing distance from the first substrate 10. The first interlayer dielectric layers ILD1 may be alternately stacked with the first gate electrodes GE1, and the second interlayer dielectric layers ILD2 may be alternately stacked with the second gate electrodes GE2.

In the cell array region CAR, first and second vertical structures VS1 and VS2 may penetrate in the first direction D1 through the stack structure ST. As used herein, "an element A penetrates in a direction X through an element B" (or similar language) may mean that the element A extends through the element B in the direction X. The first vertical structures VS1 may correspond to the memory channel structures 4220 of FIG. 3 or 4. In the cell array contact region EXR, dummy vertical structures DVS may penetrate in the first direction D1 through the third dielectric layer 50 and at least a portion of the stack structure ST. Each of the first and second vertical structures VS1 and VS2 may include a channel pad CHP adjacent to the second dielectric layer 40. The first vertical structures VS1 may be electrically connected through the channel pads CHP to the cell contact plugs CCP and the cell circuit lines CCL (e.g., bit lines).

The first, second, and dummy vertical structures VS1, VS2, and DVS may fill corresponding channel holes that penetrate the stack structure ST. Each channel hole may include a first channel hole CH1 that penetrates the first stack structure ST1 and a second channel hole CH2 that penetrates the second stack structure ST2. Each of the first and second channel holes CH1 and CH2 may have a width in the second direction D2 or the third direction D3 that decreases with increasing distance from the first substrate 10. The first and second channel holes CH1 and CH2 may be connected to each other and may have different diameters at an interface at which the first and second channel holes CH1 and CH2 are connected to each other. For example, a diameter at an upper portion of the second channel hole CH2 may be less than that at a lower portion of the first channel hole CH1. The first and second channel holes CH1 and CH2 may have a step difference at their interface at which the first and second channel holes CH1 and CH2 are connected to each other. The present inventive concepts, however, are not limited thereto, and for example, differently from that shown, three or more channel holes may be provided to have a step difference at each of two or more interfaces. Alternatively, differently from that shown, channel holes may be provided to have flat sidewalls with no step difference.

Referring to FIGS. 6A and 7, the first, second, and dummy vertical structures VS1, VS2, and DVS may include a data storage pattern DSP that conformally covers an inner sidewall of each of the first and second channel holes CH1 and CH2, a vertical semiconductor pattern VSP that conformally covers a sidewall of the data storage pattern DSP, and a buried dielectric pattern VI that is surrounded by the vertical semiconductor pattern VSP and the channel pad CHP and fills inner spaces of the first and second channel holes CH1 and CH2. The vertical semiconductor pattern VSP may be surrounded by the data storage pattern DSP. The first, second, and dummy vertical structures VS1, VS2, and DVS may have, for example, circular, oval, or bar shapes at bottom surfaces thereof.

The vertical semiconductor pattern VSP may be provided between the data storage pattern DSP and the buried dielectric pattern VI and between the data storage pattern DSP and the channel pad CHP. The vertical semiconductor pattern VSP may have a macaroni (tubular) shape or a pipe shape whose top end is closed. The data storage pattern DSP may have a macaroni (tubular) shape or a pipe shape whose top end is closed. The vertical semiconductor pattern VSP may include, for example, an impurity-doped semiconductor material, an impurity-undoped intrinsic semiconductor material, or a polycrystalline semiconductor material. The channel pad CHP may include, for example, an impurity-doped semiconductor material or a conductive material.

Referring to FIGS. 5, 6A, and 6B, a first trench TR1 and a second trench TR2 may extend in the second direction D2 and may run across the stack structure ST. The first trench TR1 may extend from the cell array region CAR toward the cell array contact region EXR. The second trench TR2 may be provided in the cell array region CAR, and may extend in the second direction D2 along the second vertical structures VS2 that are linearly arranged along the second direction D2. The first and second trenches TR1 and TR2 may each have widths in the third direction D3 that decrease with increasing distance from the first substrate 10.

A first separation pattern SS1 and a second separation pattern SS2 may respectively fill the first trench TR1 and the second trench TR2. The first and second separation patterns SS1 and SS2 may correspond to the separation structures 4230 of FIG. 3 or 4. A length in the second direction D2 of the first separation pattern SS1 may be greater than a length in the second direction D2 of the second separation pattern SS2. The first and second separation patterns SS1 and SS2 may have their sidewalls in contact with at least ones of the first and second gate electrodes GE1 and GE2 and the first and second interlayer dielectric layers ILD1 and ILD2 of the stack structure ST. The first separation pattern SS1 may be provided between a plurality of stack structures ST and may separate the stack structures ST from each other in the third direction D3. Differently from that shown, a lower portion of the first separation pattern SS1 may be buried in an upper portion of the middle circuit structure MCS, and a bottom surface of the first separation pattern SS1 may be positioned in the middle circuit structure MCS. However, some embodiments of the present inventive concepts are not limited thereto. The first and second separation patterns SS1 and SS2 may include oxide, such as silicon oxide.

A second substrate 100 may be provided on the stack structure ST. The second substrate 100 may be connected to a lower portion of each of the first and second vertical structures VS1 and VS2. The second substrate 100 may include a monocrystalline semiconductor material, such as a monocrystalline silicon layer, or a polycrystalline silicon layer. A source structure SC may be provided between the second substrate 100 and the stack structure ST. The second substrate 100 and the source structure SC may extend in the second direction D2 and the third direction D3. The second substrate 100 may have a plate shape that extends parallel to the top surface of the first substrate 10. The second substrate 100 may correspond to the common source line 4205 of FIG. 3 or 4.

The source structure SC may include a first source conductive pattern SCP1 between the stack structure ST and the second substrate 100 and a second source conductive pattern SCP2 between the stack structure ST and the first source conductive pattern SCP1. The second conductive pattern SCP2 may be provided between the first source conductive pattern SCP1 and an uppermost one of the first interlayer dielectric layers ILD1 included in the first stack structure ST1. The first source conductive pattern SCP1 may be in direct contact with the second source conductive pattern SCP2. A thickness in the first direction D1 of the first source conductive pattern SCP1 may be greater than a thickness in the first direction D1 of the second source conductive pattern SCP2. The source structure SC may include an impurity-doped semiconductor material. The source structure SC may include, for example, a semiconductor material doped with impurities having the same conductivity type as that of the second substrate 100. For example, an impurity concentration of the first source conductive pattern SCP1 may be greater than that of the second source conductive patterns SCP2 and that of the second substrate 100. According to some embodiments, on the cell array contact region EXR, a dummy dielectric pattern 110 may be provided between the second substrate 100 and the stack structure ST. The dummy dielectric pattern 110 may be located at a level substantially the same as that of the first source conductive pattern SCP1. The dummy dielectric pattern 110 may be a multi-layered dielectric pattern including different materials. The dummy dielectric pattern 110 may include, for example, at least one selected from a silicon oxide layer, a silicon nitride layer, a silicon oxynitride layer, a silicon carbide layer, and/or a silicon germanium layer.

Referring to FIGS. 6A and 7, there is illustrated a portion of the source structure SC, a portion of the second substrate 100, and one of the first vertical structures VS1 each of which includes the data storage pattern DSP, the vertical semiconductor pattern VSP, the buried dielectric pattern VI, and a lower data storage pattern DSPr. For convenience of description, the following will discuss a single first vertical structure VS1, and this discussion may also be equally applicable to other first, second, and dummy vertical structures VS1, VS2, and DVS.

The first vertical structure VS1 may have a top surface VS1*t* in contact with the second substrate 100. The top surface VS1*t* of the first vertical structure VS1 may correspond to a top surface of the lower data storage pattern DSPr. The top surface VS1*t* of the first vertical structure VS1 may be located at a higher level than that of a top surface SCP1*b* of the first source conductive pattern SCP1.

The data storage pattern DSP may include a blocking dielectric layer BLK, a charge storage layer CIL, and a tunneling dielectric layer TIL that are sequentially formed on an inner sidewall of the channel hole. The blocking dielectric layer BLK may be adjacent to the stack structure ST or the source structure SC, and the tunneling dielectric layer TIL may be adjacent to the vertical semiconductor pattern VSP. The charge storage layer CIL may be interposed between the blocking dielectric layer BLK and the tunneling dielectric layer TIL. The blocking dielectric layer BLK, the charge storage layer CIL, and the tunneling dielectric layer TIL may each extend in the first direction D1 between the stack structure ST and the vertical semiconductor pattern VSP. The data storage pattern DSP may store and/or change data by using Fowler-Nordheim tunneling induced by a voltage difference between the vertical semiconductor pattern VSP and the first and second gate electrodes GE1 and GE2. For example, the blocking dielectric layer BLK and the tunneling dielectric layer TIL may include silicon oxide, and the charge storage layer CIL may include silicon nitride or silicon oxynitride.

The first source conductive pattern SCP1 of the source structure SC may be in contact with the vertical semiconductor pattern VSP, and the second source conductive pattern SCP2 of the source structure SC may be spaced apart from the vertical semiconductor pattern VSP across the data storage pattern DSP. The first source conductive pattern SCP1 may be spaced apart from the buried dielectric pattern VI across the vertical semiconductor pattern VSP.

For example, the first source conductive pattern SCP1 may include protrusions SCP1*p* located at a level lower than that of a top surface SCP2*b* of the second source conductive pattern SCP2 or higher than that of the top surface SCP1*b* of the first source conductive pattern SCP1. The protrusions SCP1*p* may be located at a level higher than that of a bottom surface SCP2*a* of the second source conductive pattern SCP2. For example, the protrusions SCP1*p* may each have a curved shape at a surface in contact with the data storage pattern DSP or the lower data storage pattern DSPr.

Referring to FIGS. 5, 6A, and 6B, the through plugs TP may penetrate in the first direction D1 through the stack structure ST. Each of the through plugs TP may be provided on the cell array contact region EXR, and may penetrate the stepwise structure of the stack structure ST and the third dielectric layer 50 that covers the stepwise structure of the stack structure ST. The through plugs TP may be spaced apart from each other in the second direction D2. The through plugs TP may have their top surfaces (or first surfaces TPa) positioned higher than a top surface of the stack structure ST (e.g., higher than a top surface of the uppermost first interlayer dielectric layer ILD1). Although not shown, each of the through plugs TP may include a barrier pattern, and the barrier pattern may include metal nitride. The through plugs TP may include at least one selected from titanium, tantalum, ruthenium, cobalt, manganese, tungsten, nickel, copper, and/or any combination thereof.

The through plugs TP may include a first through plug TP1 and a second through plug TP2. Each of the first and second through plugs TP1 and TP2 may be provided in plural. The first through plug TP1 may be electrically connected through the first surface TPa to the backside structure BS which will be discussed below. The second through plug TP2 may be electrically connected through a second surface TPb to the middle circuit structure MCS. For example, the second through plug TP2 may be connected through the cell contact plug CCP to the cell circuit lines CCL.

Each of the through plugs TP may be electrically connected to the peripheral circuit structure PS through one of the first surface TPa or the second surface TPb. For example, at the first surface TPa, the first through plug TP1 may be electrically connected to the peripheral circuit structure PS through the backside structure BS which will be discussed below, the connection plug CNP which will be discussed below, and the middle circuit structure MCS. For another example, at the second surface TPb, the second through plug TP2 may be electrically connected through the middle circuit structure MCS to the peripheral circuit structure PS.

Each of the through plugs TP may be electrically connected to a corresponding one of the first and second gate electrodes GE1 and GE2. For example, the first through plug TP1 may be electrically connected to a corresponding electrode, and the corresponding electrode may be connected to the peripheral circuit structure PS through the first through plug TP1, the backside structure BS which will be discussed below, the connection plug CNP which will be discussed below, and the middle circuit structure MCS. For another example, the second through plug TP2 may be electrically connected to a corresponding electrode, and the corresponding electrode may be connected to the peripheral circuit structure PS through the second through plug TP2 and the middle circuit structure MCS. The first and second gate electrodes GE1 and GE2 may be electrically connected through the first and second through plugs TP1 and TP2 to the peripheral circuit structure PS, and may be electrically controlled through the peripheral circuit structure PS.

Referring to FIGS. 6A and 8, the through plugs TP may be correspondingly and electrically connected to the first and second gate electrodes GE1 and GE2. For convenience of description, the following will discuss a single through plug TP, and this discussion may also be equally applicable to other through plugs.

The through plug TP may be electrically connected to a corresponding electrode and electrically insulated from remaining electrodes. The through plug TP may penetrate the pad portion PAD of the corresponding electrode and the extension portions EP of the remaining electrodes. A sidewall dielectric pattern LI may be disposed between the through plug TP and the extension portion EP of the remaining electrodes, and may separate the through plug TP from the extension portion EP of the remaining electrodes. The sidewall dielectric pattern LI may include oxide, such as silicon oxide.

The through plug TP may include a through contact portion EC, a first protrusion contact portion PC1, and a second protrusion contact portion PC2. The through plug TP may have the through contact portion EC at a portion which penetrates in the first direction D1 through the stack structure ST. The through plug TP may have the first protrusion contact portion PC1 at another portion which protrudes in the second and third directions D2 and D3 toward the extension portion EP of the remaining electrode. The through plug TP may have the second protrusion contact portion PC2 at another portion which protrudes in the second and third directions D2 and D3 toward the pad portion PAD of the corresponding electrode.

The second protrusion contact portion PC2 may protrude more in the second and third directions D2 and D3 than the first protrusion contact portion PC1. Therefore, when viewed in the second and third directions D2 and D3, a diameter W2 of the through plug TP at a level of the second protrusion contact portion PC2 may be greater than a diameter W1 of the through plug TP at a level of the first protrusion contact portion PC1.

The pad portion PAD may include an extension pad portion EXP that extends in the second and third directions D2 and D3 from the extension portion EP, and may also include a protrusion pad portion PP that extends in the first direction D1 from the extension pad portion EXP. The presence of the protrusion pad portion PP of the pad portion PAD may cause the second protrusion contact portion PC2 to have a thickness T2 in the first direction D1 greater than a thickness T1 in the first direction D1 of the first protrusion contact portion PC1.

Referring to FIGS. 5 to 6B and 9A to 9C, the connection plug CNP may penetrate the third dielectric layer 50. The connection plug CNP may be provided in plural. The connection plug CNP may have a width in the second direction D2 or the third direction D3 that decreases in the first direction D1. For convenience of description, the connection plug CNP is illustrated to reside side by side in the second direction D2 with the through plugs TP, but the present inventive concepts are not limited thereto. The connection plug CNP may include a metallic material, such as tungsten.

The backside structure BS may be provided on the stack structures ST. The backside structure BS may include a second substrate 100 on the stack structure ST, a backside contact plug BCP that penetrates the second substrate 100, backside separation patterns BSP that surround the backside contact plug BCP, a fourth dielectric layer 80 that surrounds the backside contact plug BCP and covers the second substrate 100, a fifth dielectric layer 90 on the fourth dielectric layer 80, and backside circuit lines BCL in the fifth dielectric layer 90.

The backside contact plug BCP may be provided in plural, and for example, a pair of backside contact plugs BCP may be provided. The pair of backside contact plugs BCP may be electrically connected to each other through the backside circuit line BCL. One of the pair of backside contact plugs BCP may be electrically connected to a corresponding through plug TP (e.g., a corresponding first through plug TP1). The other of the pair of backside contact plugs BCP may be electrically connected to a corresponding connection plug CNP. For example, the pair of backside contact plugs BCP may electrically connect the corresponding through plug TP and the corresponding connection plug CNP to each other through the backside circuit line BCL. For example, the pair of backside contact plugs BCP may allow the corresponding through plug TP and the corresponding connection plug CNP to connect to each other in a one-to-one manner. The present inventive concepts, however, are not limited thereto. The pair of backside contact plugs BCP may electrically connect the corresponding through plug TP to the peripheral circuit structure PS. Each of the backside contact plugs BCP may have a width that decreases with decreasing distance in the first direction D1 from the cell array structure CS (e.g., the stack structure ST). For example, each of the backside contact plugs BCP may have a width that increases with increasing distance in the first direction D1 from the first substrate 10.

The backside circuit lines BCL may have various structures and configurations. For example, as shown in the figures, the backside circuit line BCL may be a single-layered circuit line. For another example, the backside circuit lines BCL may be a wiring structure including multi-layered circuit lines and contact plugs that connect the circuit lines to each other. This, however, is by way of example only, and the present inventive concepts are not limited thereto.

The backside contact plug BCP and the backside circuit line BCL may include at least one selected from titanium, tantalum, ruthenium, cobalt, manganese, tungsten, nickel, copper, and/or any combination thereof.

The backside separation pattern BSP may separate the backside contact plug BCP and the second substrate 100 from each other. The backside separation pattern BSP may insulate the backside contact plug BCP and the second substrate 100 from each other. For example, the backside separation pattern BSP may surround a lateral surface of the backside contact plug BCP. The backside separation pattern BSP, the fourth dielectric layer 80, and the fifth dielectric layer 90 may include one or more of silicon oxide, silicon nitride, silicon oxynitride, and/or low-refractive materials.

Structures of the backside contact plugs BCP may be variously changed, but the present inventive concepts are not limited thereto. For example, as shown in FIG. 9A, the pair of backside contact plugs BCP may extend in the first direction D1 in the second substrate 100 and the fourth dielectric layer 80 and may connect the corresponding through plug TP (e.g., the first through plug TP1) and the corresponding connection plug CNP, respectively, to the backside circuit lines BCL. For another example, as shown in FIG. 9B, the backside contact plug BCP connected to the corresponding connection plug CNP may be spaced apart from the second substrate 100 in the second or third direction D2 or D3 and may not extend in the first direction D1 through the second substrate 100. In other words, the backside contact plug BCP connected to the corresponding connection plug CNP may extend in the third and fourth dielectric layers 50 and 80 in the first direction D1, but may not extend in the second substrate 100 in the first direction D1. For another example, as shown in FIG. 9C, the pair of backside contact plugs BCP may completely penetrate in the first direction D1 into the second substrate 100 and may further extend to a lower level than the second substrate 100 in the first direction D1. In other words, the backside contact plug BCP connected to the corresponding connection plug CNP and the backside contact plug BCP connected to the corresponding through plug TP may each extend in the first direction D1 in the fourth dielectric layer 80 and may each extend in the first direction D1 entirely through the second substrate 100 such that each extend in the third dielectric layer 50 in the first direction D1. For example, the backside contact plug BCP connected to the corresponding connection plug CNP and the backside contact plug BCP connected to the corresponding through plug TP may each extend in the first direction D1 in the third and fourth dielectric layers 50 and 80 and through the second substrate 100.

The first through plug TP1 of the through plugs TP may be electrically connected through the first surface TPa to the peripheral circuit structure PS, and the second through plug TP2 of the through plugs TP may be electrically connected through the second surface TPb to the peripheral circuit structure PS. For example, a wiring process for the backside structure BS may be used to connect at least one (e.g., the first through plug TP1) of the through plugs TP to the peripheral circuit structure PS. In addition, the through plugs TP may be provided to penetrate the stack structure ST, irrespective of height of a corresponding one of the first and second gate electrodes GE1 and GE2. Therefore, it may be possible to reduce difficulty in wiring process for the three-dimensional semiconductor memory device and thus to easily fabricate the three-dimensional semiconductor memory device.

Figure 10A:
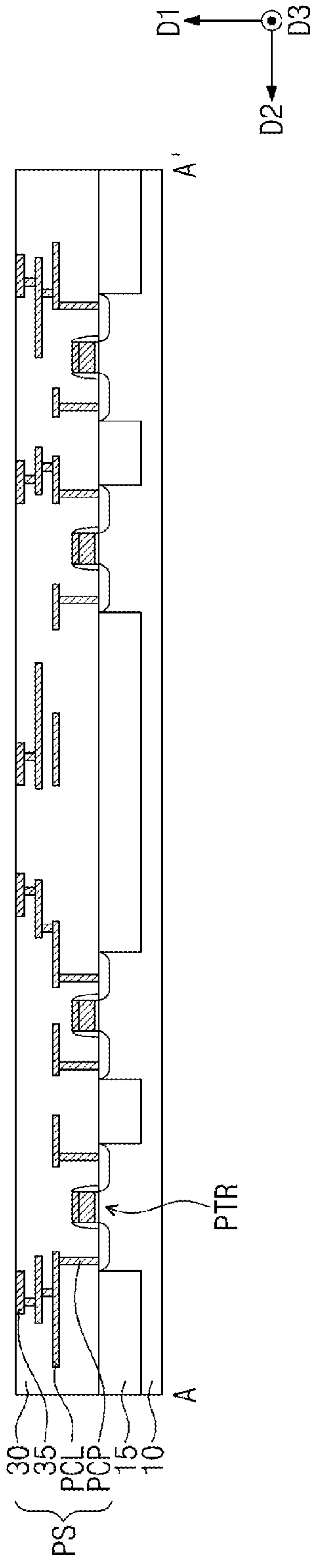
FIGS. 10A and 10B illustrate cross-sectional views respectively taken along lines A-A' and B-B' of FIG. 5, showing a method of fabricating a three-dimensional semiconductor memory device according to some embodiments of the present inventive concepts.
Figure 10B:
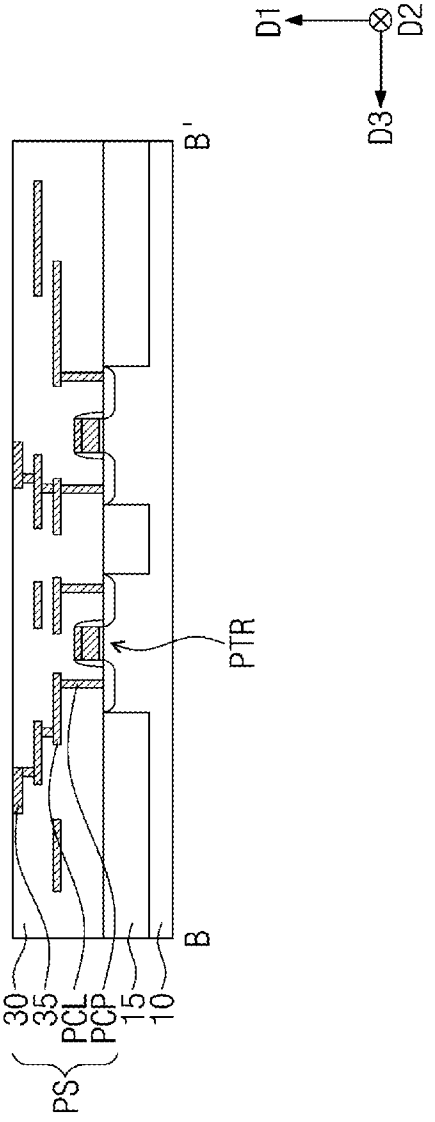

FIGS. 10A and 10B illustrate cross-sectional views respectively taken along lines A-A' and B-B' of FIG. 5, showing a method of fabricating a three-dimensional semiconductor memory device according to some embodiments of the present inventive concepts. FIGS. 11A, 12, 13, 14A, 15, and 16A illustrate cross-sectional views taken along line C-C' of FIG. 5, showing a method of fabricating a three-dimensional semiconductor memory device according to some embodiments of the present inventive concepts. FIGS. 11B, 14B, and 16B illustrate cross-sectional views taken along line D-D' of FIG. 5, showing a method of fabricating a three-dimensional semiconductor memory device according to some embodiments of the present inventive concepts.

The following will describe a three-dimensional semiconductor memory device according to the present inventive concepts with reference to the accompanying drawings. For brevity of description, a repetitive description will be omitted.

Referring to FIGS. 5, 10A, and 10B, a peripheral circuit structure PS may be formed on a first substrate 10. The formation of the peripheral circuit structure PS may include forming a device isolation layer 15 within the first substrate 10, forming peripheral transistors PTR on an active section of the first substrate 10 defined by the device isolation layer 15, and forming peripheral contact plugs PCP electrically connected to the peripheral transistors PTR, peripheral circuit lines PCL, first bonding pads 35, and a first dielectric layer 30 that covers the peripheral contact plugs PCP, the peripheral circuit lines PCL, and the first bonding pads 35.

The first bonding pads 35 may have their top surfaces substantially coplanar with that of the first dielectric layer 30. In this description below, the phrase "substantially coplanar with" may mean that a planarization process can be performed. The planarization process may include, for example, a chemical mechanical polishing (CMP) process or an etch-back process.

In describing with reference to FIGS. 11A to 16B, a "top surface" may refer to a "bottom surface" when viewed from the fabricated three-dimensional semiconductor memory device discussed with reference to FIGS. 6A and 6B, and a "bottom surface" may refer to a "top surface" when viewed from the fabricated three-dimensional semiconductor memory device discussed with reference to FIGS. 6A and 6B.

Figure 11A:
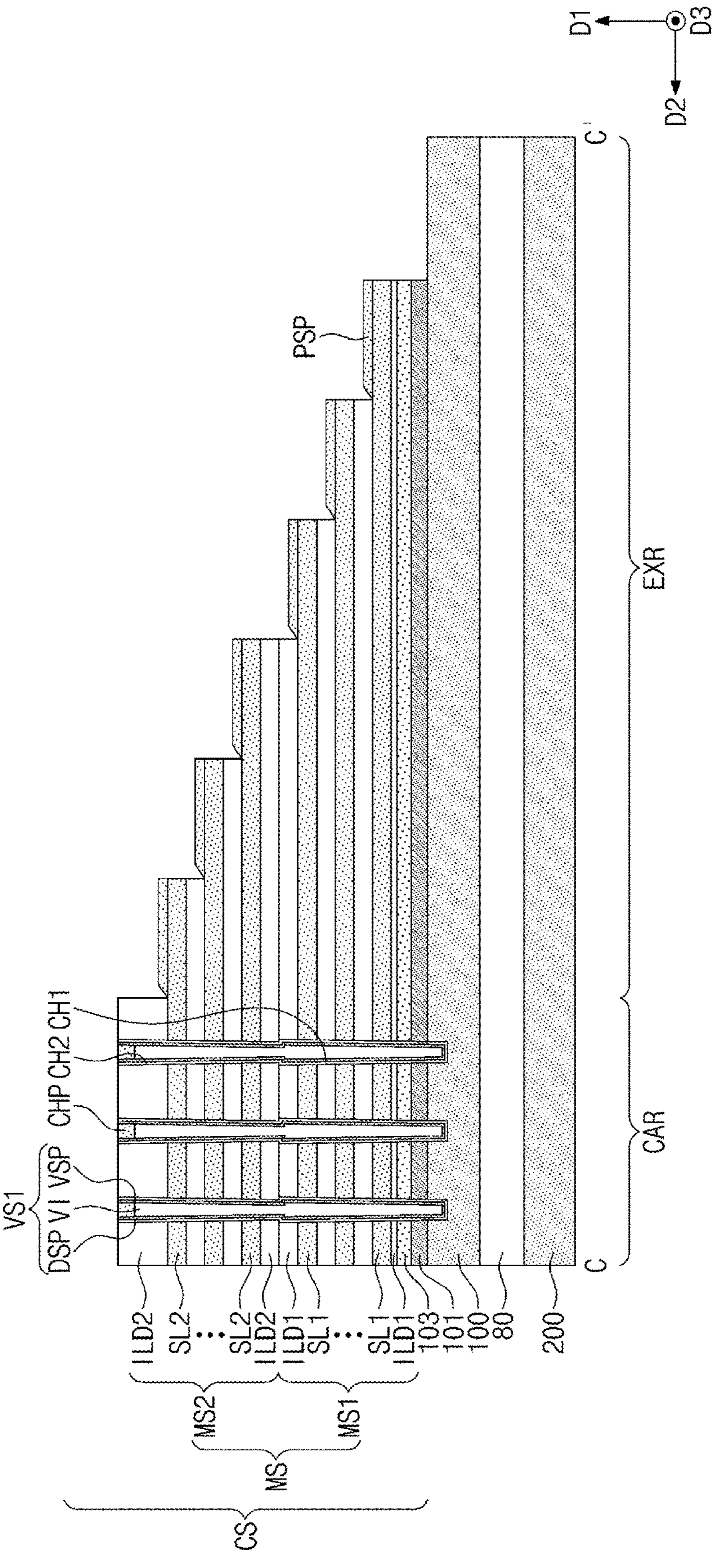
FIGS. 11A, 12, 13, 14A, 15, and 16A illustrate cross-sectional views taken along line C-C' of FIG. 5, showing a method of fabricating a three-dimensional semiconductor memory device according to some embodiments of the present inventive concepts.
Figure 11B:
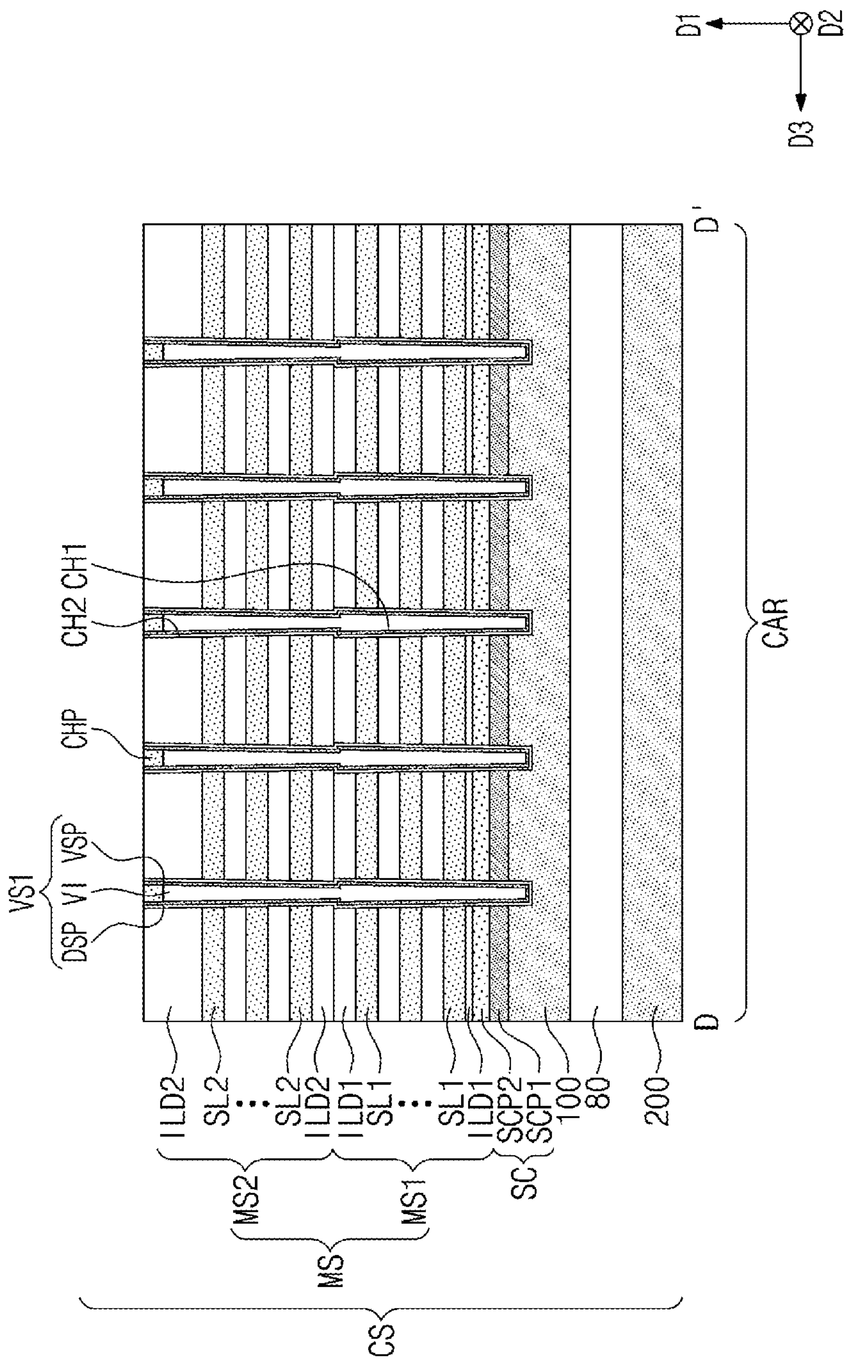
FIGS. 11B, 14B, and 16B illustrate cross-sectional views taken along line D-D' of FIG. 5, showing a method of fabricating a three-dimensional semiconductor memory device according to some embodiments of the present inventive concepts.

Referring to FIGS. 5, 11A, and 11B, a fourth dielectric layer 80, a second substrate 100, a lower sacrificial layer 101, a lower semiconductor layer 103, and a mold structure MS may be formed on a carrier substrate 200. The carrier substrate 200 may be, for example, a silicon substrate, but the present inventive concepts are not limited thereto. The second substrate 100 and the lower semiconductor layer 103 may be formed of an impurity-doped semiconductor material. The lower sacrificial layer 101 may be formed of, for example, silicon nitride. Alternatively, the lower sacrificial layer 101 may be formed of a plurality of dielectric layers that constitute a multi-layered structure.

The formation of the mold structure MS may include forming a first mold structure MS1 and forming a second mold structure MS2 on the first mold structure MS1. The formation of the first mold structure MS1 may include sequentially stacking first interlayer dielectric layers ILD1 and first sacrificial layers SL1, forming first channel holes CH1 that penetrate in a first direction D1 through the first interlayer dielectric layers ILD1 and the first sacrificial layers SL1, and filling the first channel holes CH1 with a channel sacrificial layer (not shown). The formation of the second mold structure MS2 may include sequentially stacking second interlayer dielectric layers ILD2 and second sacrificial layers SL2 on the first mold structure MS1, and forming second channel holes CH2 that penetrate in the first direction D1 through the second interlayer dielectric layers ILD2 and the second sacrificial layers SL2. The second channel holes CH2 may vertically overlap the first channel holes CH1, and the formation of the second channel holes CH2 may expose the channel sacrificial layer that fill the first channel holes CH1. Afterwards, the exposed channel sacrificial layer may be removed, and the first and second channel holes CH1 and CH2 may expose lateral surfaces of the first and second mold structures MS1 and MS2, respectively.

The first and second sacrificial layers SL1 and SL2 may be formed of a material that can be etched with an etch selectivity with respect to the first and second interlayer dielectric layers ILD1 and ILD2. For example, the first and second sacrificial layers SL1 and SL2 may be formed of silicon nitride, and the first and second interlayer dielectric layers ILD1 and ILD2 may be formed of silicon oxide. The first and second sacrificial layers SL1 and SL2 may have substantially the same thickness, and the first and second interlayer dielectric layers ILD1 and ILD2 may have different thicknesses on partial sections.

Afterwards, first, second, and dummy vertical structures VS1, VS2, and DVS may be formed to fill the first and second channel holes CH1 and CH2. The formation of the first, second, and dummy vertical structures VS1, VS2, and DVS may include forming a data storage pattern DSP and a vertical semiconductor pattern VSP that conformally cover inner lateral surfaces of the first and second channel holes CH1 and CH2, forming a buried dielectric pattern VI in a space surrounded by the vertical semiconductor pattern VSP, and forming a channel pad CHP in a space surrounded by the buried dielectric pattern VI and the data storage pattern DSP.

A stepwise structure may be formed by partially etching the first and second interlayer dielectric layers ILD1 and ILD2 and the first and second sacrificial layers SL1 and SL1 on a cell array contact region EXR.

For example, the formation of the stepwise structure may include forming a mask pattern (not shown), and then sequentially etching the first and second interlayer dielectric layers ILD1 and ILD2 and the first and second sacrificial layers SL1 and SL2 that are provided below the mask pattern, while progressively reducing a width of the mask pattern.

Alternatively, the formation of the stepwise structure may include performing an etching process several times, while changing an etching amount and section for each etching process. For example, when forming a three-layered stepwise structure, light etching may be performed on sections where steps at uppermost and lowermost layers are intended to be formed, and heavy etching may be performed on sections where steps at middle and lowermost layers are intended to be formed. Therefore, the step at the uppermost layer that has experienced only the light etching may be formed at a relatively higher level, and the step at the lowermost layer that has experienced the light etching and the heavy etching may be formed at a relatively lower level. The step at the middle layer that has experienced the heavy etching performed once may be located at a level between those of other two steps. This, however, is by way of example only, and the present inventive concepts are not limited thereto.

After the formation of the stepwise structure, pad sacrificial patterns PSP may be formed on corresponding steps, covering the stepwise structure. The pad sacrificial patterns PSP may be formed on ends of the first and second sacrificial layers SL1 and SL2. The pad sacrificial patterns PSP may be formed of a material whose etching characteristics are the same as those of the first and second sacrificial layers SL1 and SL2. For example, the pad sacrificial patterns PSP may include silicon nitride.

The formation of the pad sacrificial patterns PSP may include forming a pad sacrificial layer (not shown) that covers top and lateral surfaces of the steps, and removing a portion of the pad sacrificial layer on the lateral surfaces of the steps. The remainder of the pad sacrificial layer left on the top surfaces of the steps may be the pad sacrificial patterns PSP. Before the removal of the pad sacrificial layer, a plasma treatment process may be executed on the pad sacrificial layer on the top surfaces of the steps. Therefore, there may be a difference in etch rate between the pad sacrificial layer on the top surfaces of the steps and the pad sacrificial layer on the lateral surfaces of the steps. For example, the etch rate of the pad sacrificial layer on the top surfaces of the steps may be less than that of the pad sacrificial layer on the lateral surfaces of the steps. As a result, while the pad sacrificial layer may be etched on the lateral surfaces of the steps, the pad sacrificial layer on the top surfaces of the steps may not be removed, but may be formed into the pad sacrificial patterns PSP.

Figure 12:
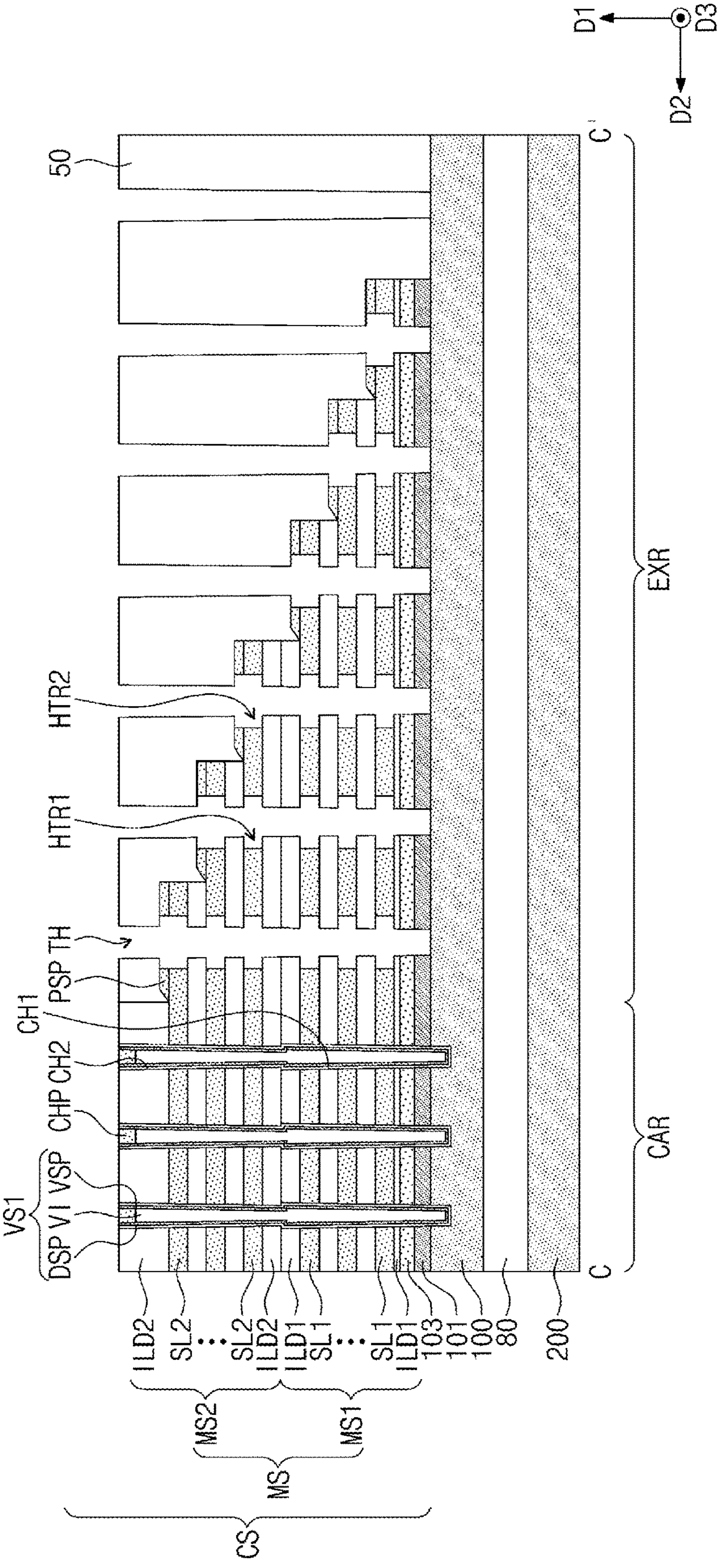

Referring to FIGS. 5 and 12, a third dielectric layer 50 may be formed to cover the stepwise structure. Thereafter, through holes TH may be formed to penetrate the third dielectric layer 50 and the mold structure MS. The through holes TH may be provided on the cell array contact region EXR. The through holes TH may have their bottom surfaces located lower than that of a lowermost first interlayer dielectric layer ILD1. The through holes TH may expose portions of a sidewall of the mold structure MS.

After that, the portions of the sidewall of the mold structure MS exposed to the through holes TH may be removed to form first horizontal through recesses HTR1 and second horizontal through recesses HTR2. For example, the first and second sacrificial layers SL1 and SL2 and the pad sacrificial patterns PSP of the mold structure MS exposed to the through holes TH may be partially removed, and the first and second horizontal through recesses HTR1 and HTR2 may be formed on sections from which are removed the first and second sacrificial layers SL1 and SL2 and the pad sacrificial patterns PSP. The first horizontal through recess HTR1 may be formed on an area in which the pad sacrificial pattern PSP is not provided, and the second horizontal through recess HTR2 may be formed on an area from which one of the first and second sacrificial layers SL1 and SL2 is removed together with the pad sacrificial pattern PSP. A width in the first direction D1 of the first horizontal through recess HTR1 may be less than a width in the first direction D1 of the second horizontal through recess HTR2.

Figure 13:
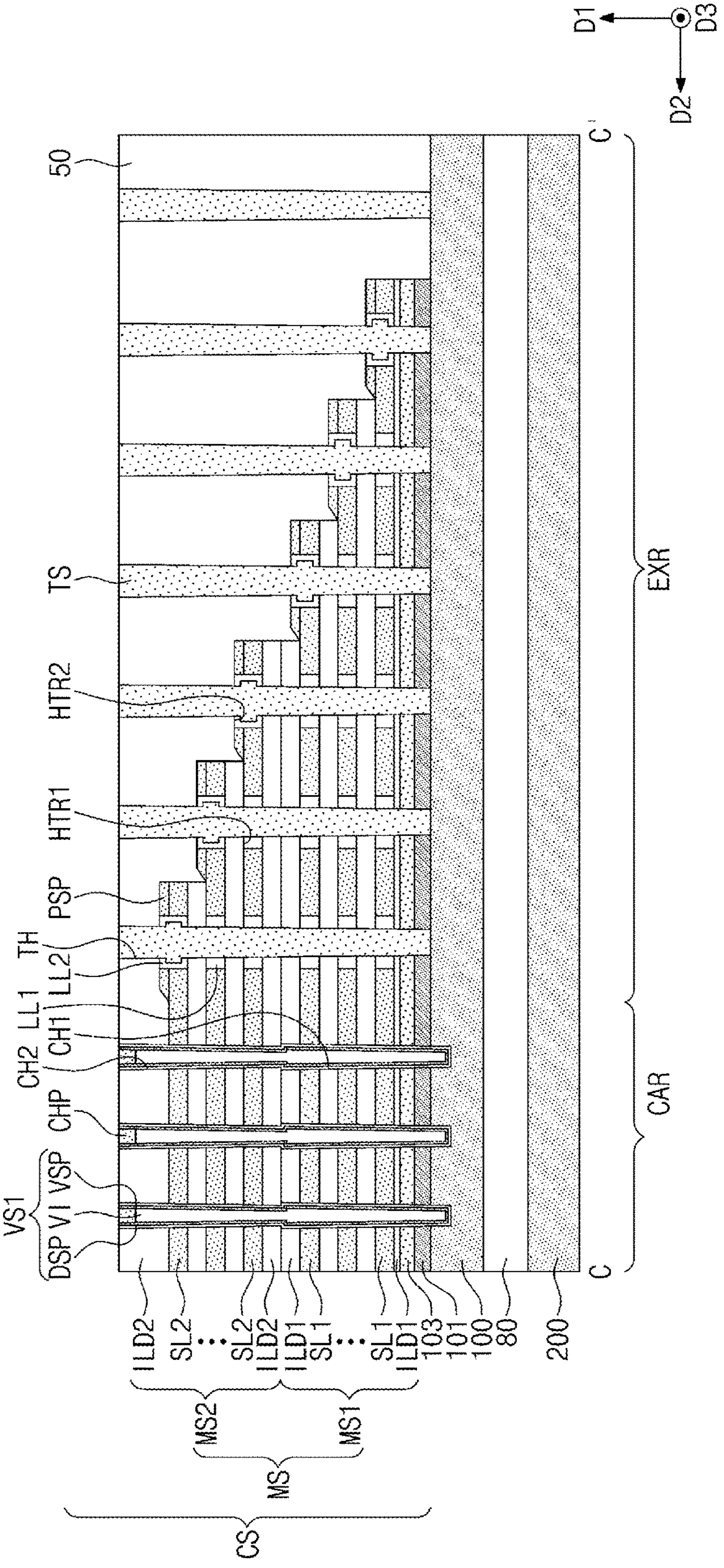

Referring to FIGS. 5 and 13, a first sidewall dielectric layer LL1 may be formed in the first horizontal through recess HTR1, and a second sidewall dielectric layer LL2 may be formed in the second horizontal through recess HTR2. The formation of the first and second sidewall dielectric layers LL1 and LL2 may include depositing a sidewall dielectric layer (not shown) that conformally covers inner walls of the first and second horizontal through recesses HTR1 and HTR2 and the through holes TH, and removing the sidewall dielectric layer on sidewalls of the through holes TH to separate the first and second sidewall dielectric layers LL1 and LL2 from each other. The sidewall dielectric layer may include oxide, such as silicon oxide.

The first sidewall dielectric layer LL1 may fill an inside of the first horizontal through recess HTR1. The first horizontal through recess HTR1 may have a small width in the first direction D1, and thus the inside of the first horizontal through recess HTR1 may be easily filled when the sidewall dielectric layer is deposited. Although not shown, the first sidewall dielectric layer LL1 may have therein an empty area, such as a seam or void, in the inside of the first horizontal thorough recess HTR1. The empty area of the first sidewall dielectric layer LL1 may not be connected to the through hole TH.

The second sidewall dielectric layer LL2 may conformally cover the inner wall of the second horizontal through recess HTR2, and may not fill at least a portion of the second horizontal through recess HTR2. The non-filled area of the second horizontal through recess HTR2 may be connected to the through hole TH.

Thereafter, a through sacrificial pattern TS may be formed to fill the through hole TH. The through sacrificial pattern TS may fill an unoccupied portion of the second horizontal through recess HTR2. The through sacrificial pattern TS may include at least one selected from a silicon oxide layer, a silicon nitride layer, a silicon oxynitride layer, a silicon carbide layer, and/or a silicon germanium layer, but the present inventive concepts are not limited thereto.

Figure 14A:
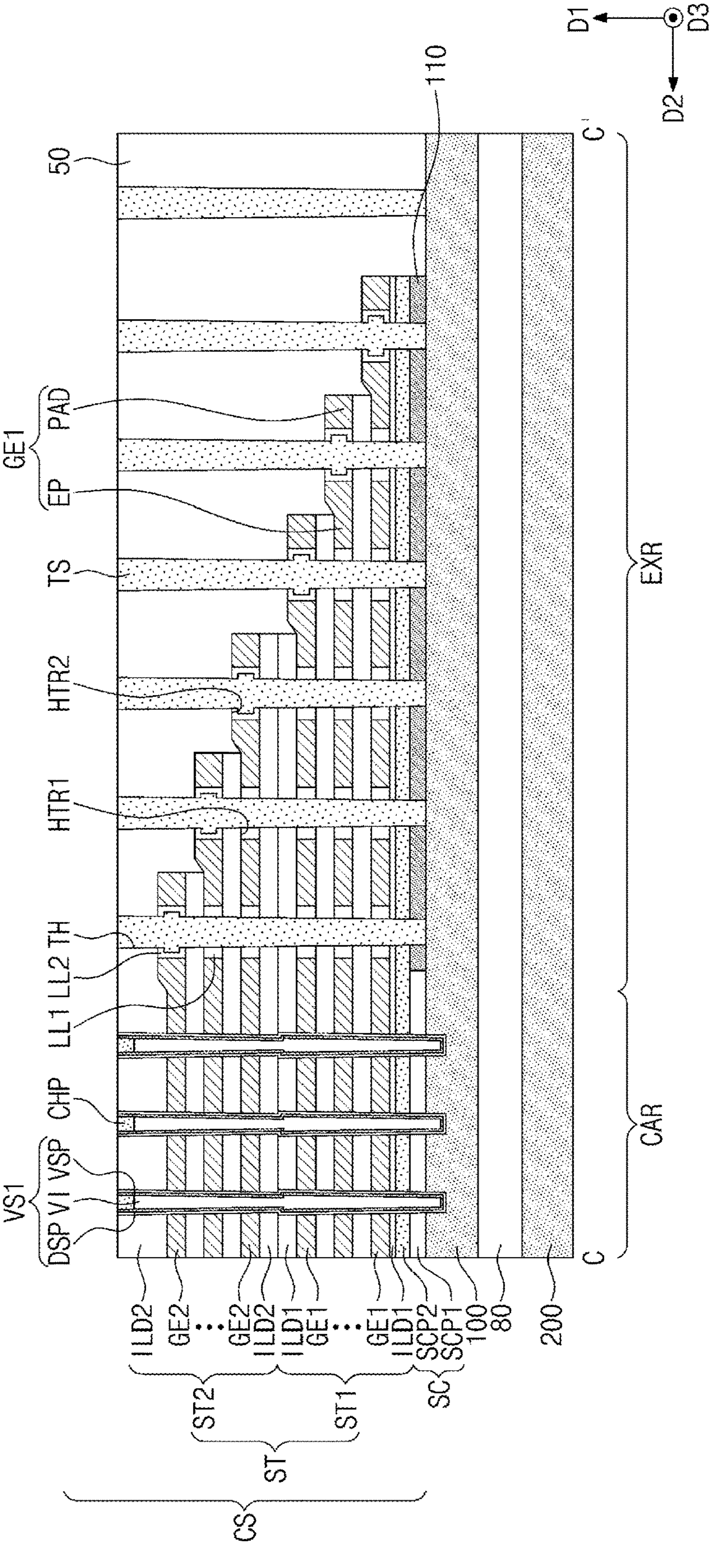
Figure 14B:
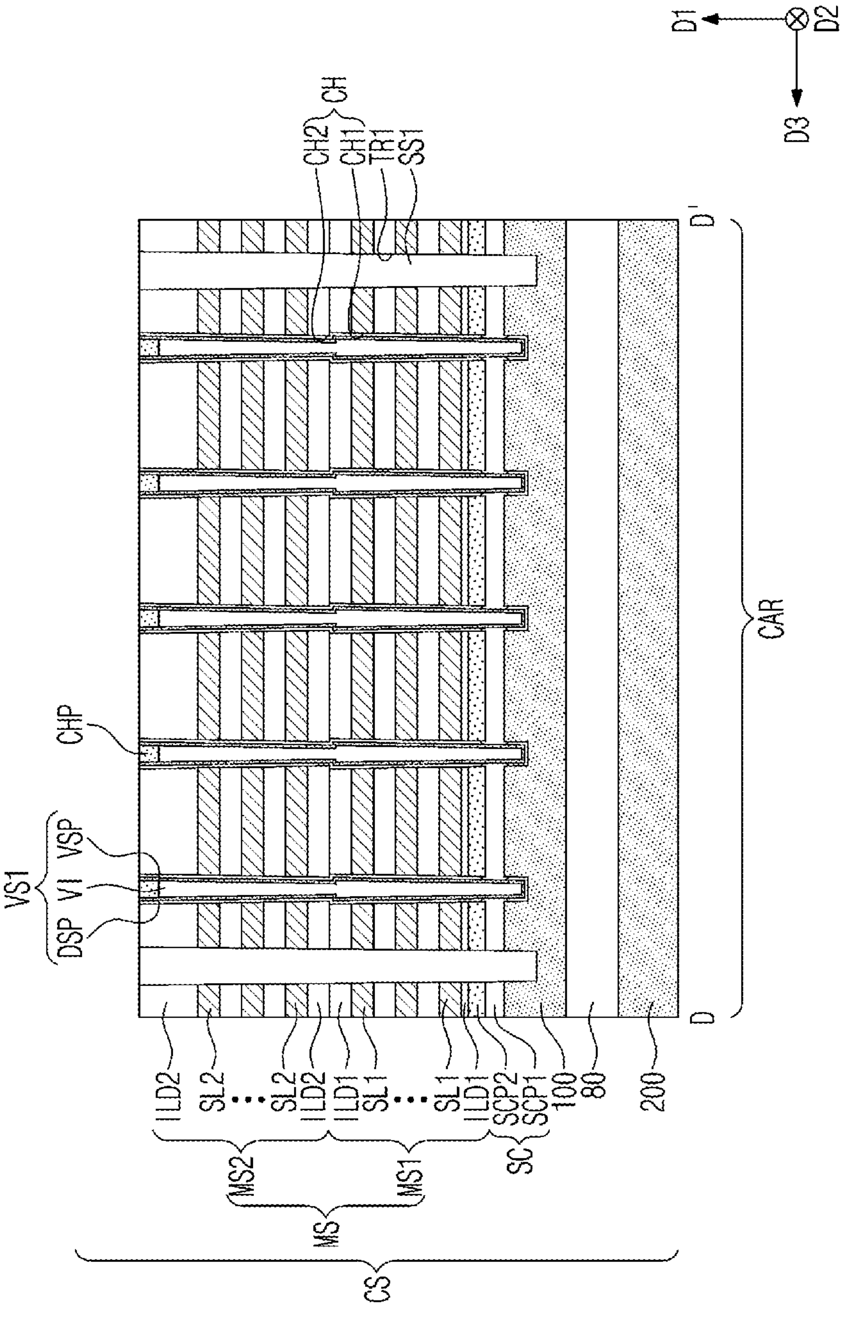

Referring to FIGS. 5, 14A, and 14B, first and second trenches TR1 and TR2 may be formed to penetrate in the first direction D1 through the mold structure MS. The formation of the first and second trenches TR1 and TR2 may include anisotropically etching the mold structure MS. The first and second trenches TR1 and TR2 may extend along a second direction D2. The first trench TR1 may extend from a cell array region CAR toward the cell array contact region EXR. The second trench TR2 may be provided in the cell array region CAR, and may extend in the second direction D2 along the second vertical structures VS2 that are linearly arranged along the second direction D2. The first and second trenches TR1 and TR2 may expose the sidewall of the mold structure MS, for example, sidewalls of the first and second sacrificial layers SL1 and SL2 and sidewalls of the pad sacrificial patterns PSP. The first and second trenches TR1 and TR2 may also outwardly expose the lower sacrificial layer 101.

Afterwards, on the cell array region CAR, a process may be performed to replace the lower sacrificial layer 101 with a first source conductive pattern SCP1. The formation of the first source conductive pattern SCP1 may include performing an isotropic etching process on the exposed lower sacrificial layer 101. In the isotropic etching process, a portion of the data storage pattern DSP may be isotropically etched, and a portion of the vertical semiconductor pattern VSP may be exposed. An impurity-doped polycrystalline silicon layer may be deposited to form the first source conductive pattern SCP1. In this step, a remaining lower semiconductor layer 103 may be called a second source conductive pattern SCP2, and the first source conductive pattern SCP1 and the second source conductive pattern SCP2 may constitute a source structure SC. The source structure SC may be formed between the second substrate 100 and the mold structure MS.

After the formation of the source structure SC, the first and second sacrificial layers SL1 and SL2 and the pad sacrificial patterns PSP may be replaced with first and second gate electrodes GE1 and GE2. The formation of the first and second gate electrodes GE1 and GE2 may include performing an isotropic etching process on the first and second sacrificial layers SL1 and SL2 and the pad sacrificial patterns PSP that are exposed through the first and second trenches TR1 and TR2, and disposing the first and second gate electrodes GE1 and GE2 in positions from which are removed the first and second sacrificial layers SL1 and SL2 and the pad sacrificial patterns PSP. In this step, a first stack structure ST1 may be formed which includes the first gate electrodes GE1 and the first interlayer dielectric layers ILD1, and a second stack structure ST2 may be formed which includes the second gate electrodes GE2 and the second interlayer dielectric layers ILD2. The first and second stack structures ST1 and ST2 may constitute a stack structure ST.

The first and second gate electrodes GE1 and GE2 may have their pad portions PAD each of which is formed in an area (e.g., an area adjacent to the second horizontal through recess HTR2) from which one of the first and second sacrificial layers SL1 and SL2 is removed together with the pad sacrificial pattern PSP. The first and second gate electrodes GE1 and GE2 may have their extension portions EP each of which is formed in an area (e.g., an area adjacent to the first horizontal through recess HTR1) in which the pad sacrificial pattern PSP is not provided.

Afterwards, the first and second trenches TR1 and TR2 may be filled with a dielectric material to form first and second separation patterns SS1 and SS2.

Figure 15:
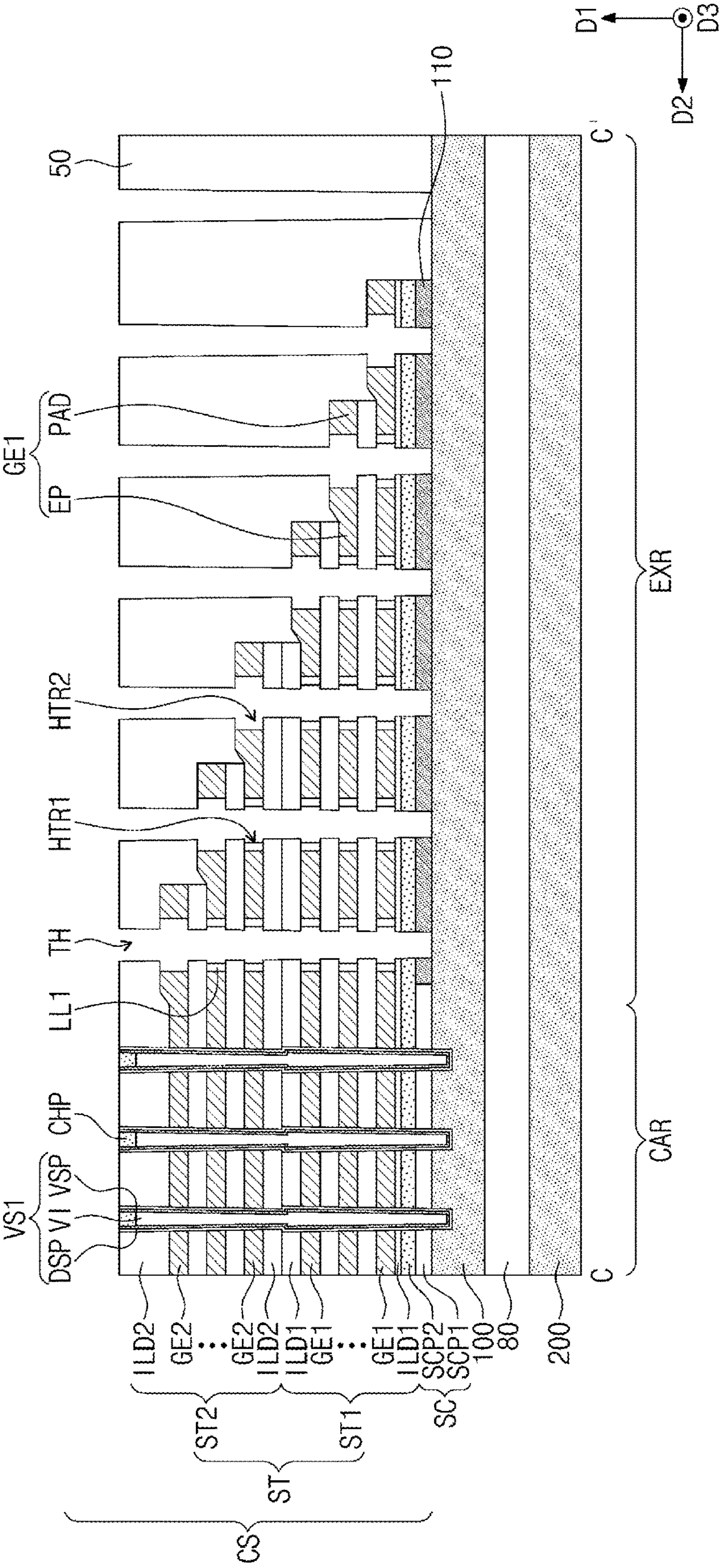

Referring to FIGS. 5 and 15, the through sacrificial patterns TS may be removed, and the through holes TH may be outwardly exposed again. The removal of the through sacrificial patterns TS may expose the first and second sidewall dielectric layers LL1 and LL2 in the first and second horizontal through recesses HTR1 and HTR2.

A removal process may be performed on the first and second sidewall dielectric layers LL1 and LL2. The removal process may include, for example, isotropically etching the first and second sidewall dielectric layers LL1 and LL2. In this step, the second sidewall dielectric layer LL2 having a relatively small thickness may be completely removed, and thus the first and second gate electrodes GE1 and GE2 may be outwardly exposed in the second horizontal through recess HTR2. The first sidewall dielectric layer LL1 having a relatively large thickness may not be completely removed, and a residue of the first sidewall dielectric layer LL1 may constitute a sidewall dielectric pattern LI. The sidewall dielectric pattern LI may block the first and second gate electrodes GE1 and GE2 from the outside.

Figure 16A:
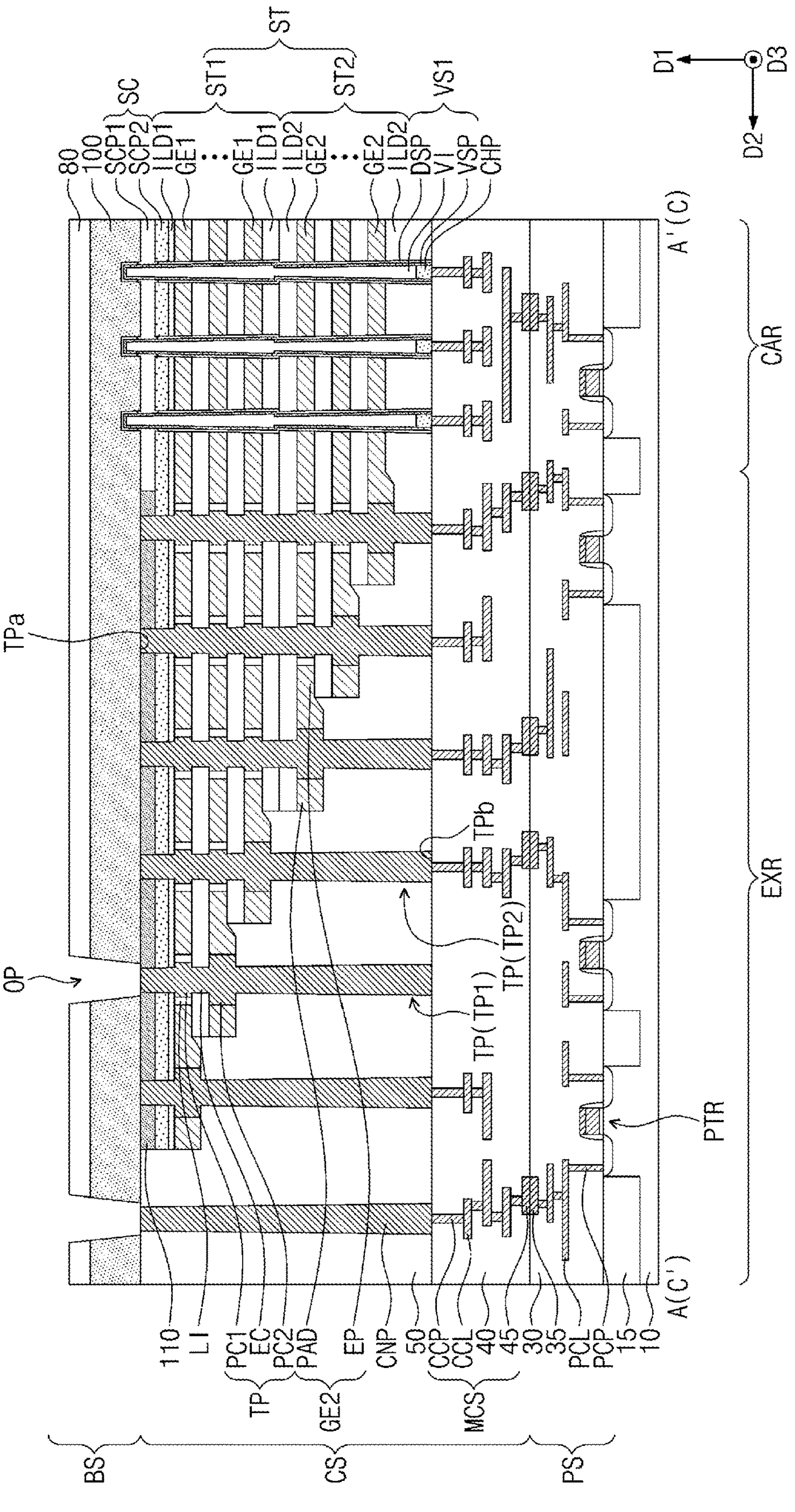
Figure 16B:
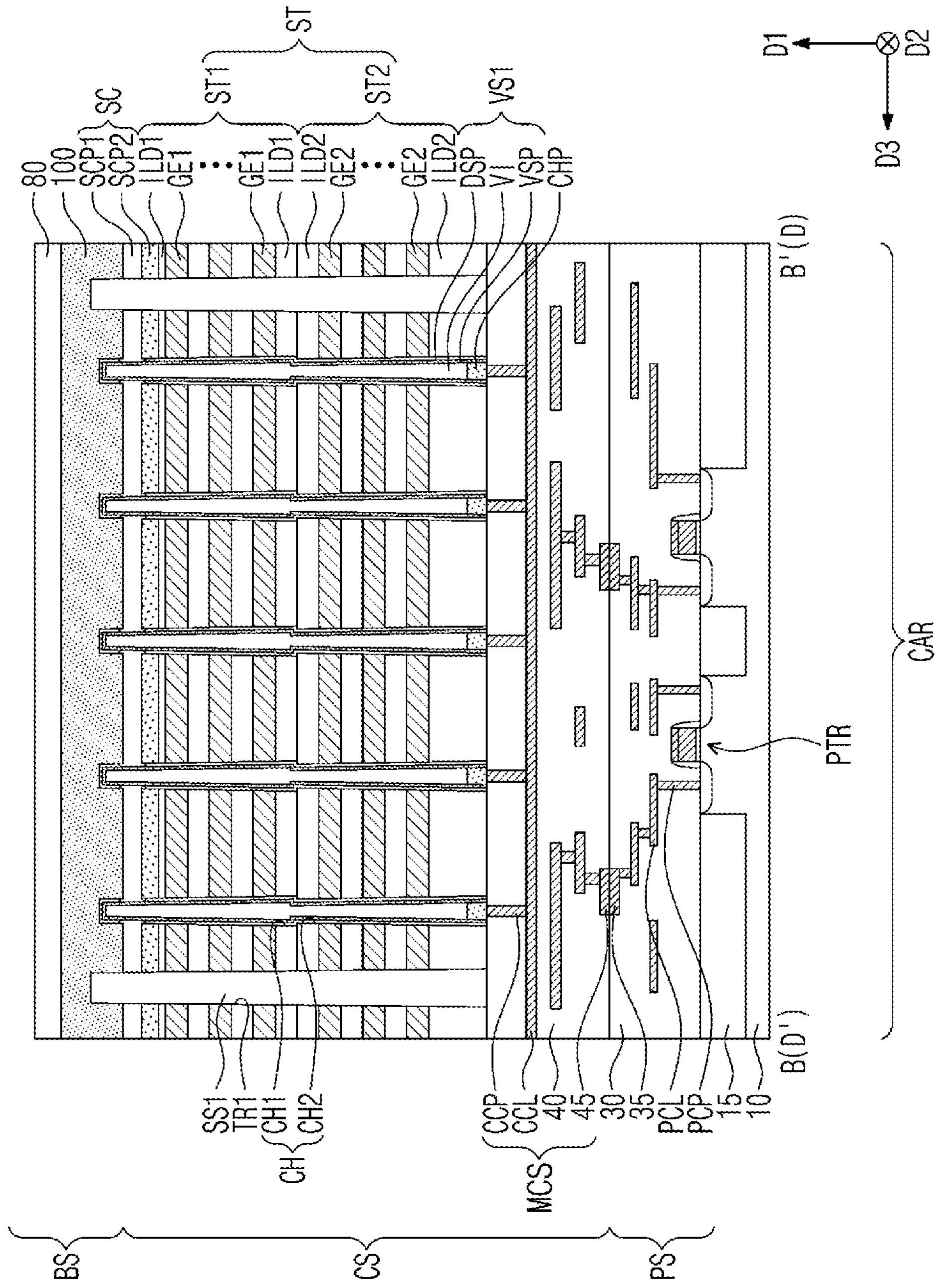

Referring to FIGS. 5, 16A, and 16B, through plugs TP and a connection plug CNP may be formed to fill the through holes TH. Each of the through plugs TP may further fill the first and second horizontal through recesses HTR1 and HTR2. Each of the through plugs TP may be electrically connected through the second horizontal through recess HTR2 to a corresponding one of the first and second gate electrodes GE1 and GE2.

A middle circuit structure MCS may be formed on the stack structure ST (e.g., the second stack structure ST2). The middle circuit structure MCS may include a cell contact plug CCP and a cell circuit line CCL each of which is formed of a single or multiple layers. The second through plug TP2 of the through plugs TP may be connected to the cell contact plug CCP. Second bonding pads 45 may be formed to come into electrical connection with the cell contact plugs CCP and the cell circuit lines CCL. A second dielectric layer 40 may be formed to surround the cell contact plugs CCP, the cell circuit lines CCL, and the second bonding pads 45. The second dielectric layer 40 may be formed one or more times, and may be formed regardless of when the cell contact plugs CCP, the cell circuit lines CCL, and the second bonding pads 45 are formed. The second bonding pads 45 may each have a surface that is outwardly exposed without being covered with the second dielectric layer 40. As a result, the method discussed with reference to FIGS. 11A to 16B may be used to form a cell array structure CS on the carrier substrate 200.

The cell array structure CS formed on the carrier substrate 200 may be bonded to the peripheral circuit structure PS formed on the first substrate 10 formed by the method discussed with reference to FIGS. 10A and 10B. The carrier substrate 200 may be provided on the first substrate 10 to allow the cell array structure CS and the peripheral circuit structure PS to face each other. The first bonding pads 35 of the peripheral circuit structure PS and the second bonding pads 45 of the cell array structure CS may be merged while being in contact with each other. After the bonding of the first and second bonding pads 35 and 45, the carrier substrate 200 may be removed from the cell array structure CS. When the carrier substrate 200 is removed, a portion of the fourth dielectric layer 80 may be removed together with the carrier substrate 200.

An opening OP may be formed to penetrate the second substrate 100 and the fourth dielectric layer 80. The opening OP may outwardly expose the connection plug CNP and the first through plug TP1 of the through plugs TP. The opening OP may vertically overlap the connection plug CNP and the first through plug TP1. The formation of the opening OP may include forming a mask pattern (not shown) on the fourth dielectric layer 80, and using the mask pattern to anisotropically etch the fourth dielectric layer 80 and the second substrate 200.

Referring back to FIGS. 5, 6A, and 6B, a backside separation pattern BSP may be formed to conformally cover an inner sidewall of the opening OP. The formation of the backside separation pattern BSP may include forming a backside separation layer (not shown) that conformally covers an inner wall of the opening OP, and removing a portion of the backside separation layer to allow the opening OP to expose the first through plug TP1 and the connection plug CNP.

A backside contact plug BCP may be formed to fill an unoccupied portion of the opening OP.

For example, the formation of the backside contact plug BCP may include forming a backside contact plug layer (not shown) that fills the opening OP and covers the fourth dielectric layer 80, and removing an upper portion of the backside contact plug layer to expose a top surface of the fourth dielectric layer 80. Afterwards, backside circuit lines BCL may be formed to electrically connect the backside contact plugs BCP to each other.

For another example, the formation of the backside contact plug BCP may include forming a backside contact plug layer (not shown) that fills the opening OP and covers the fourth dielectric layer 80, and removing a portion of the backside contact plug layer to simultaneously form the backside contact plug BCP and the backside circuit lines BCL.

The formation of the backside contact plug BCP is not limited to that mentioned above, but the backside contact plug BCP may be formed in various ways. Although not shown, the backside contact plug BCP and the backside circuit line BCL may be a wiring structure including multi-layered circuit lines and contact plugs that connect the multi-layered circuit lines to each other.

A backside structure may be utilized to achieve an electrical connection between through plugs and a peripheral circuit structure. In addition, the through plugs may be provided to penetrate a stack structure, irrespective of height of a corresponding one of gate electrodes. Therefore, it may be possible to reduce difficulty in wiring process for a three-dimensional semiconductor memory device and thus to easily fabricate the three-dimensional semiconductor memory device.

Although the present disclosure has been described in connection with some embodiments of the present inventive concepts illustrated in the accompanying drawings, it will be understood by one of ordinary skill in the art that variations in form and detail may be made therein without departing from the scope of the present inventive concepts. The above disclosed embodiments should thus be considered illustrative and not restrictive.

What is claimed is:

1. A three-dimensional semiconductor memory device, comprising:
- a peripheral circuit structure on a first substrate;
- a cell array structure on the peripheral circuit structure; and
- a backside structure on the cell array structure;
- wherein the cell array structure includes:
  - a stack structure including gate electrodes and interlayer dielectric layers that are alternately stacked along a first direction;
  - through plugs that extend in the first direction through the stack structure, each of the through plugs including a first surface adjacent to the backside structure and a second surface opposite to the first surface;
  - a middle circuit structure between the stack structure and the peripheral circuit structure, the middle circuit structure being electrically connected to the peripheral circuit structure; and
  - a connection plug electrically connected to the middle circuit structure and the backside structure,
- wherein the through plugs include:
  - a first through plug electrically connected through the first surface to the backside structure; and
  - a second through plug electrically connected through the second surface to the middle circuit structure, and at least one of (i) the first through plug is electrically connected to a first pad portion of a first gate electrode of the gate electrodes or (ii) the second through plug is electrically connected to a second pad portion of a second gate electrode of the gate electrodes.

2. The device of claim 1, wherein each of the through plugs is electrically connected to the peripheral circuit structure through one of the first surface or the second surface.

3. The device of claim 2, wherein the first through plug is electrically connected to the peripheral circuit structure through the first surface, the backside structure, the connection plug, and the middle circuit structure.

4. The device of claim 2, wherein the second through plug is electrically connected to the peripheral circuit structure through the second surface and the middle circuit structure.

5. The device of claim 1, wherein the backside structure includes:
- a second substrate on the stack structure;
- backside contact plugs electrically connected to the first through plug and the connection plug, respectively, at least a portion of the backside contact plugs extending in the second substrate; and
- a backside contact line that electrically connects the backside contact plugs to each other,
- wherein the backside contact plugs are spaced apart from the second substrate.

6. The device of claim 5, wherein
- the backside structure further includes backside separation patterns that at least partially surround the backside contact plugs, and
- the backside separation patterns space apart the backside contact plugs from the second substrate.

7. The device of claim 5, wherein the backside contact plugs have a width that decreases with decreasing distance in the first direction from the stack structure.

8. The device of claim 5, wherein a respective one of the backside contact plugs that is electrically connected to the first through plug is electrically connected through the backside contact line to a respective one of the backside contact plugs that is electrically connected to the connection plug.

9. The device of claim 1, wherein
- the middle circuit structure includes a cell contact plug and cell circuit lines electrically connected to the cell contact plug, and
- the second through plug is electrically connected through the second surface to the cell contact plug and the cell circuit lines.

10. The device of claim 1, wherein
- each of the gate electrodes includes an extension portion that extends in a second direction perpendicular to the first direction and a pad portion that is adjacent to the extension portion and at one end of each of the gate electrodes in the second direction, and
- each of the through plugs is electrically connected to the pad portion of a respective one of the gate electrodes.

11. The device of claim 10, further comprising a sidewall dielectric pattern between respective ones of the through plugs and the extension portion.

12. The device of claim 1, wherein the first surface is higher in the first direction than a top surface of an uppermost one of the interlayer dielectric layers with the first substrate providing a base reference plane.

13. A three-dimensional semiconductor memory device, comprising:

a peripheral circuit structure on a first substrate;
a cell array structure on the peripheral circuit structure; and
a backside structure on the cell array structure,
wherein the cell array structure includes:
a stack structure including gate electrodes and interlayer dielectric layers that are alternately stacked along a first direction;
a source structure on the stack structure;
a vertical structure that extends in the first direction through the stack structure and is electrically connected to the source structure;
a through plug that extends in the first direction through the stack structure, the through plug including a first surface adjacent to the backside structure and a second surface opposite to the first surface;
a middle circuit structure between the stack structure and the peripheral circuit structure, the middle circuit structure being electrically connected to the peripheral circuit structure; and
a connection plug electrically connected to the middle circuit structure and the backside structure,
wherein the backside structure includes:
a second substrate on the source structure;
backside contact plugs electrically connected to the through plug and the connection plug, respectively, at least a portion of the backside contact plugs extending in the second substrate; and
a backside contact line that electrically connects the backside contact plugs to each other,
wherein the through plug is electrically connected through the first surface to the backside structure and the connection plug, and
wherein the first surface is higher in the first direction than a top surface of an uppermost one of the interlayer dielectric layers with the first substrate providing a base reference plane.

14. The device of claim 13, wherein the through plug is electrically connected to the peripheral circuit structure through the first surface, the backside structure, the connection plug, and the middle circuit structure.

15. The device of claim 13, wherein the backside contact plugs are spaced apart from the second substrate.

16. The device of claim 15, wherein
the backside structure further includes backside separation patterns that surround the backside contact plugs, and
the backside separation patterns space apart the backside contact plugs from the second substrate.

17. The device of claim 15, wherein the backside contact plugs have a width that decreases with decreasing distance in the first direction from the stack structure.

18. The device of claim 15, wherein a respective one of the backside contact plugs that is electrically connected to the through plug is electrically connected through the backside contact line to a respective one of the backside contact plugs that is electrically connected to the connection plug.

19. An electronic system, comprising:
a three-dimensional semiconductor memory device including a peripheral circuit structure, a cell array structure, and a backside structure that are stacked on a first substrate; and
a controller that is electrically connected through an input/output pad to the three-dimensional semiconductor memory device and is configured to control the three-dimensional semiconductor memory device,
wherein the cell array structure includes:
a stack structure including gate electrodes and interlayer dielectric layers that are alternately stacked along a first direction;
through plugs that extend in the first direction through the stack structure, each of the through plugs including a first surface adjacent to the backside structure and a second surface opposite to the first surface;
a middle circuit structure between the stack structure and the peripheral circuit structure, the middle circuit structure being electrically connected to the peripheral circuit structure; and
a connection plug electrically connected to the middle circuit structure and the backside structure,
wherein the through plugs include a first through plug that is electrically connected through the first surface to the backside structure and a second through plug that is electrically connected through the second surface to the middle circuit structure, and at least one of (i) the first through plug is electrically connected to a first pad portion of a first gate electrode of the gate electrodes or (ii) the second through plug is electrically connected to a second pad portion of a second gate electrode of the gate electrodes.

20. The electronic system of claim 19, wherein the first surface is higher in the first direction than a top surface of an uppermost one of the interlayer dielectric layers with the first substrate providing a base reference plane.

* * * * *